(12) United States Patent
Holm et al.

(10) Patent No.: US 6,809,008 B1
(45) Date of Patent: Oct. 26, 2004

(54) INTEGRATED PHOTOSENSOR FOR CMOS IMAGERS

(75) Inventors: Paige M. Holm, Phoenix, AZ (US); Jon J. Candelaria, Scottsdale, AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/652,632

(22) Filed: Aug. 28, 2003

(51) Int. Cl.[7] .............................................. H01L 21/30
(52) U.S. Cl. ...................................... 438/455; 438/459
(58) Field of Search ................................ 438/455–459

(56) References Cited

U.S. PATENT DOCUMENTS

| | | | |
|---|---|---|---|
| 2003/0157748 A1 | * | 8/2003 | Kim et al. .................. 438/107 |
| 2004/0041178 A1 | * | 3/2004 | Yang ........................... 257/233 |

* cited by examiner

Primary Examiner—H. Jey Tsai

(74) Attorney, Agent, or Firm—William F. Koch

(57) ABSTRACT

An exemplary system and method for providing an integrated photosensing element suitably adapted for use in CMOS imaging applications is disclosed as comprising inter alia: a processed CMOS host wafer (460) bonded with a monocrystalline, optically active donor wafer (300); a photosensing element (390) integrated in said optically active donor wafer (300) having an interconnect via (505, 495, 485) substantially decoupled from the photosensing element (390), wherein the host (460) and donor (300) wafers are bonded through the optically active material in a region disposed near a metalization surface (450, 455, 445) of the CMOS layer (460) in order to allow fabrication of the interconnect (505, 495, 485). Disclosed features and specifications may be variously controlled, configured, adapted or otherwise optionally modified to further improve or otherwise optimize photosensing performance or other material characteristics. Exemplary embodiments of the present invention representatively provide for integrated photosensing components that may be readily incorporated with existing technologies for the improvement of CMOS imaging, device package form factors, weights and/or other manufacturing, device or material performance metrics.

4 Claims, 15 Drawing Sheets

-PRIOR ART-

-PRIOR ART-

INTEGRATED PHOTOSENSOR FOR CMOS IMAGERS

The present invention generally relates to semiconductor and imaging devices; and more particularly, to systems and methods for integrating photosensing elements for use in CMOS imaging applications.

CMOS imagers have begun to challenge CCDs in many electronic imaging applications and are gaining in popularity. The primary advantages of CMOS imagers are their relatively low cost generally resulting from the use of standard, high-volume CMOS processes and their ability to be integrated with native CMOS electronics for control and image processing; this in contrast to CCDs, which typically employ specialized processing optimized for image capturing operations that are not generally amenable to large-scale integration of electronics.

Because the photodiodes (PDs) of CMOS imagers are usually fabricated within the same material layer and with similar processes as the electronics, and these materials and processes are often dominated by and optimized for electronic circuitry, the optical and optoelectronic design of the photosensor are generally compromised. Representative limitations involve the Si material itself wherein a fixed band gap generally obstructs the use of band gap engineering as an effective design tool. The material may be responsive to light at visible wavelengths enabling use for many imaging/camera applications, but very weak in the near-IR spectral region where additional applications may exist. Due to the indirect band gap, light absorption may be relatively weak, even at visible wavelengths. Accordingly, thick absorbing layers and deep junctions may be needed to achieve high efficiency; these same design criteria generally being in conflict with those for high performance electronic applications.

Incompatibility between the optoelectronic and electronic requirements may be further exacerbated by current scaling trends—in terms of both the pixel pitch and the progression to smaller critical dimension CMOS process technologies (i.e., technology scaling). As the size of the pixel shrinks to reduce the cost of imaging chips, the illuminated area of the photodetector is also typically reduced thereby decreasing the captured signal level. Moreover, as the photodetector active area is reduced, the dark current becomes dominated by the perimeter causing inter alia the noise current density to increase. Together, these effects generally operate to degrade the signal to noise performance of the sensor.

There is a current trend that involves increasing the amount of electronic circuitry within each pixel from about the 3–4 transistor level for active pixel sensors (APS) to more than about 100 transistors for digital pixel sensors (DPS). This desire for increased signal processing functionality within the pixel escalates competition for 'real estate' within the pixel area creating additional problems generally associated with shrinking the PD active area, reducing the fill factor within the pixel, and applying advanced process technologies.

Migration to advanced process technologies may further compromise PD device design and performance. $0.25\mu$ technologies and beyond typically employ suicides that are optically opaque and potentially leaky, as well as shallow trench isolation (STI) which may often lead to higher perimeter-generated dark current levels. Furthermore, reduced lateral dimensions are generally attended by reduced vertical dimensions leading to thinner layers and shallower junctions as well as higher doping levels and reduced carrier diffusion lengths. Reduced supply voltages also may negatively impact charge collection and storage capability of the PD. Moreover, an ever-increasing number of interconnect levels and corresponding isolating dielectric layers generally decreases the optical throughput and coupling efficiency to the photodetector and introduces additional sources of reflection and scattering that can lead to elevated levels of optical crosstalk.

Efforts to improve the level of PD performance can limit flexibility and performance in the CMOS electronics as well. Minimizing the number of interconnect levels to improve the optical coupling to the PD, for example, may make interconnect routing more difficult and less area-efficient.

The co-integration of the photosensor with the CMOS electronics (i.e., within the same material layer, using the same processes, etc.) within the pixel of CMOS imagers may severely limit both the performance of the photosensor and the flexibility of the system architectural design. This problem may be further complicated by progression to more advanced CMOS technology generations which generally utilize trench isolation, non-transparent silicides, and increasing numbers of interconnect levels. The current trend toward increase functionality within the pixel (as with digital pixel sensors—DPS) adds more electronic circuitry within the pixel creating competition for pixel area, decreasing fill factor and further compromising of performance. To allow enhanced optimization of the photosensing and the electronics functions, as well as greater flexibility in architectural design, a new imager platform is needed.

REPRESENTATIVE SUMMARY

In various representative aspects, the present invention provides integrated photosensors for CMOS imagers using 3D integration schemes in which inter alia a monocrystalline active layer is incorporated over and in close proximity to a processed CMOS wafer. The monocrystalline layer may be transferred to the CMOS wafer by means of, for example, wafer-to-wafer (or die-to-wafer) bonding followed by substrate removal. The integrated photosensing layer is sufficiently proximate to the final metallization of the CMOS wafer to provide inter alia a high density of interconnects for electrical contacts. An exemplary method for fabricating such a device is disclosed as comprising the steps of inter alia: providing a processed CMOS wafer; providing a photosensing element fabricated in an integrated optically active layer comprising a monocrystalline material; bonding the optically active layer to the CMOS layer in a region disposed substantially near a metalization surface of the CMOS layer in order to permit fabrication of an interconnect via, wherein the photosensing element is substantially decoupled from the interconnect via.

Additional advantages of the present invention will be set forth in the Detailed Description which follows and may be obvious from the Detailed Description or may be learned by practice of exemplary embodiments of the invention. Still other advantages of the invention may be realized by means of any of the instrumentalities, methods or combinations particularly pointed out in the claims.

REPRESENTATIVE ILLUSTRATIONS

Representative elements, operational features, applications and/or advantages of the present invention reside inter alia in the details of construction and operation as more fully hereafter depicted, described and claimed—reference being made to the accompanying drawings forming a part hereof, wherein like numerals refer to like parts throughout. Other elements, operational features, applications and/or advantages will become apparent to skilled artisans in light of certain exemplary embodiments recited in the Detailed Description, wherein:

Figure 3:
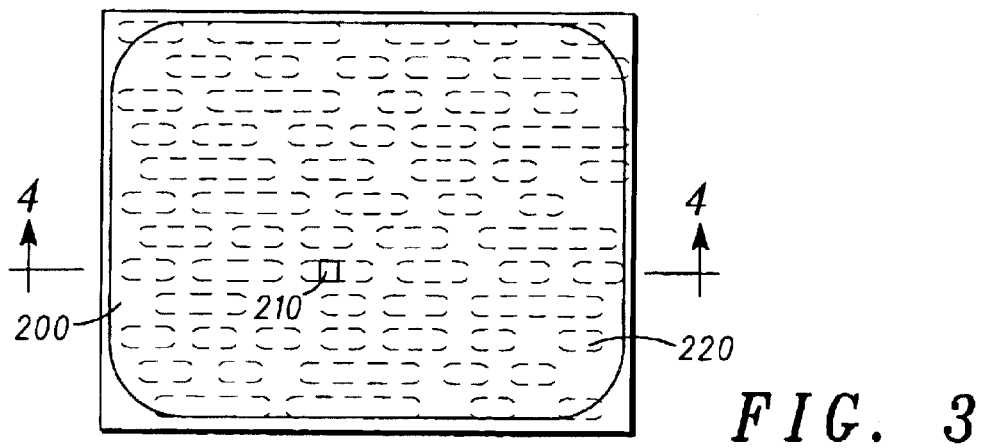
Figure 4:
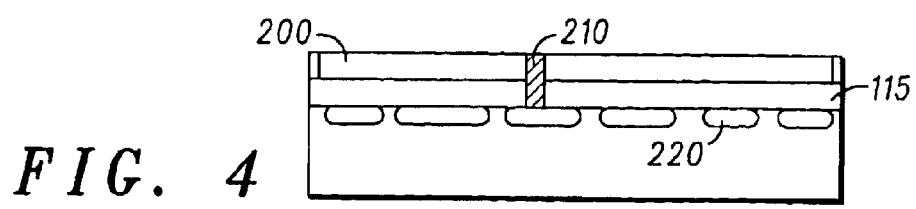
Figure 5:
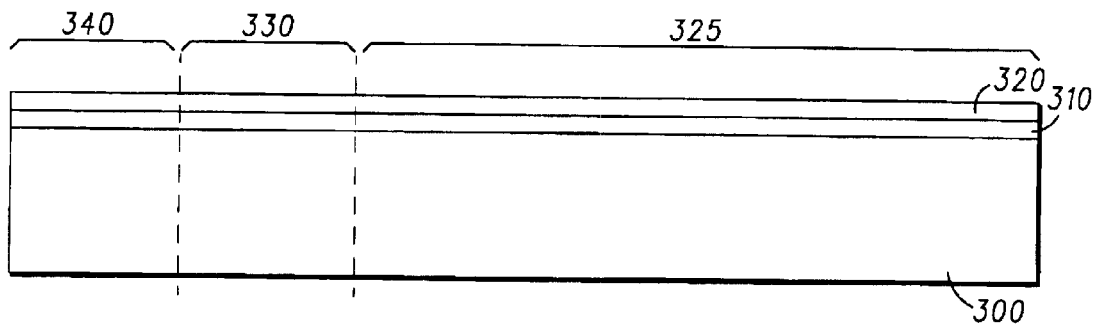
Figure 6:
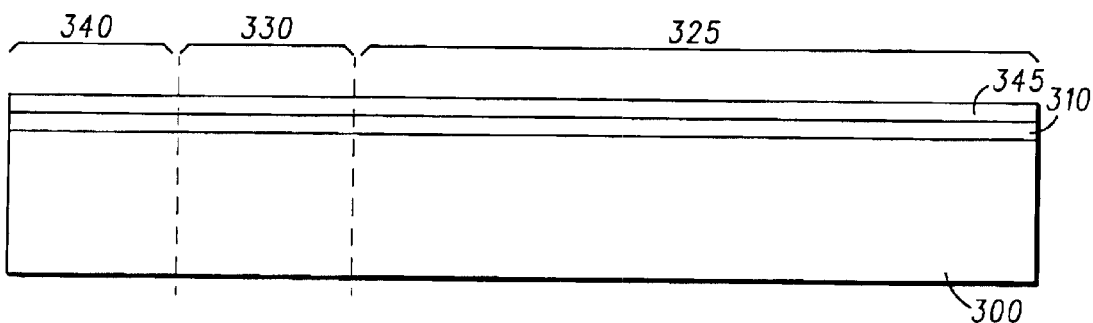
Figure 7:
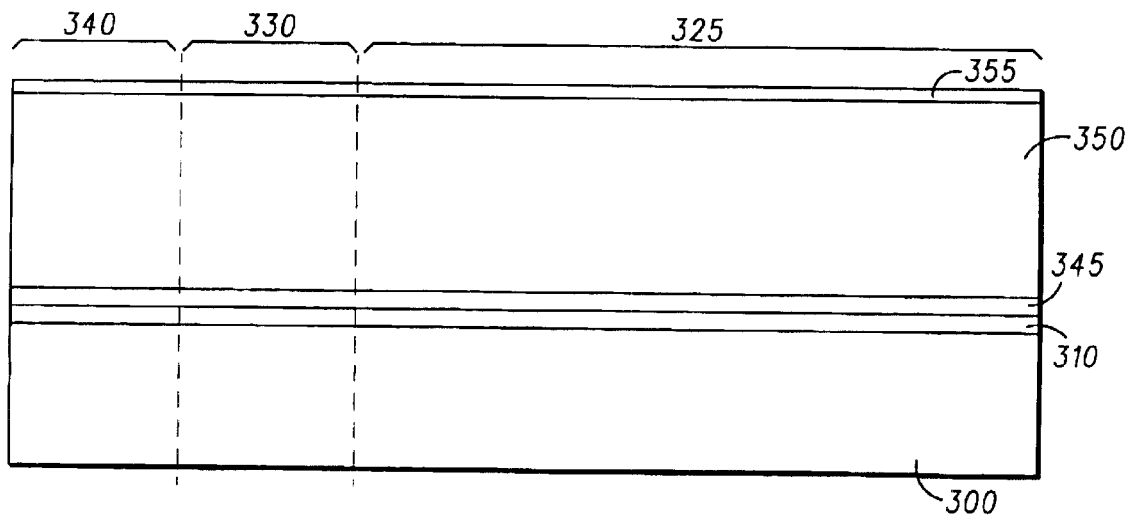
Figure 8:
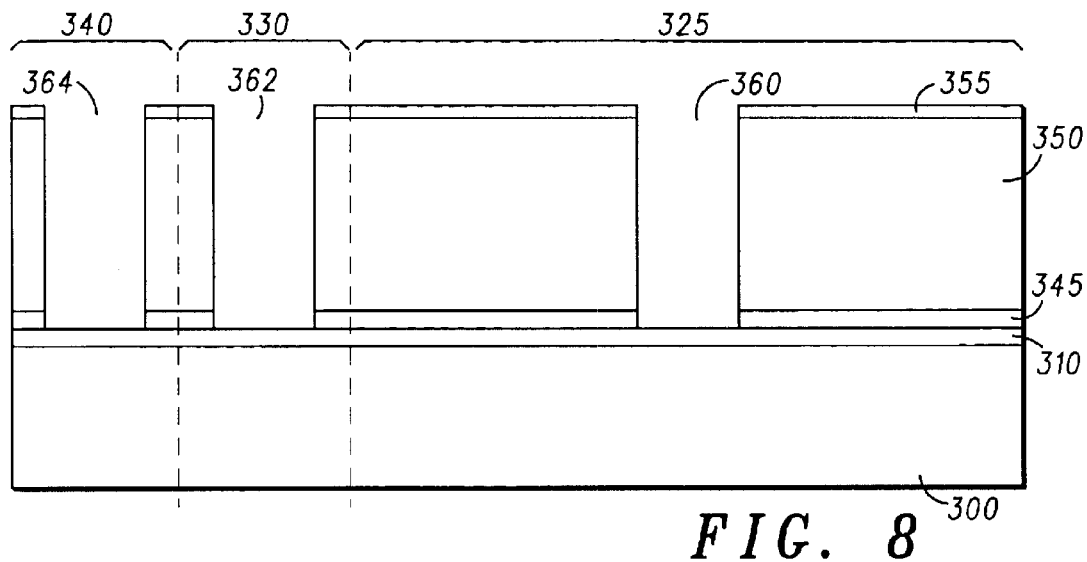
Figure 9:
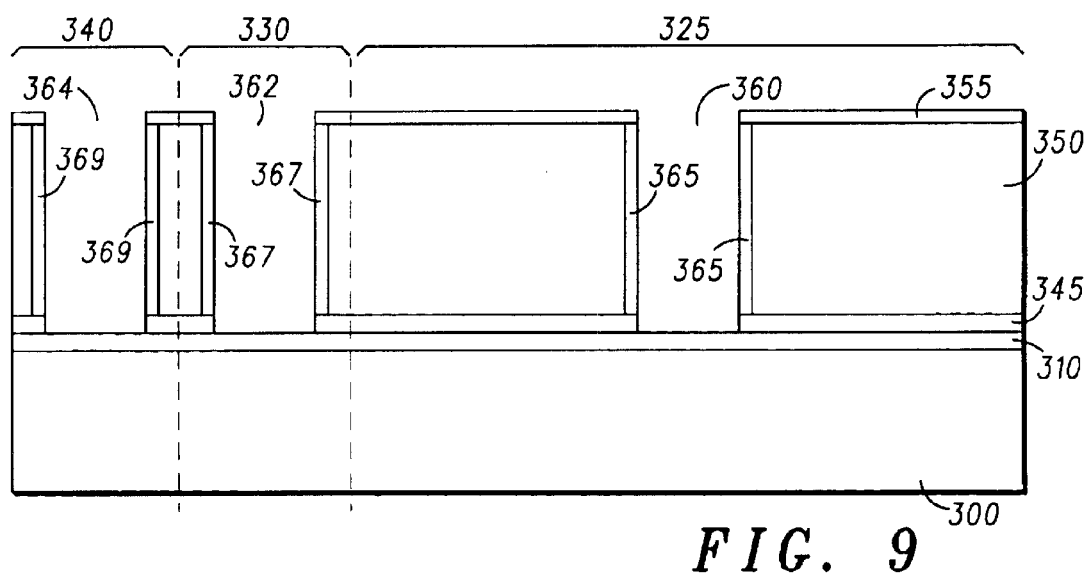
Figure 10:
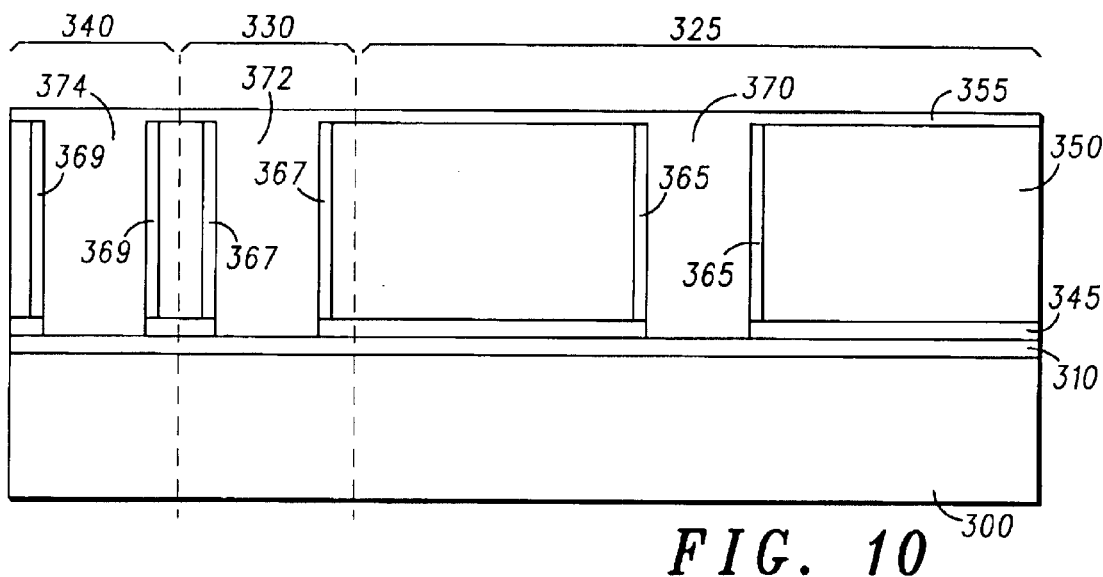
Figure 11:
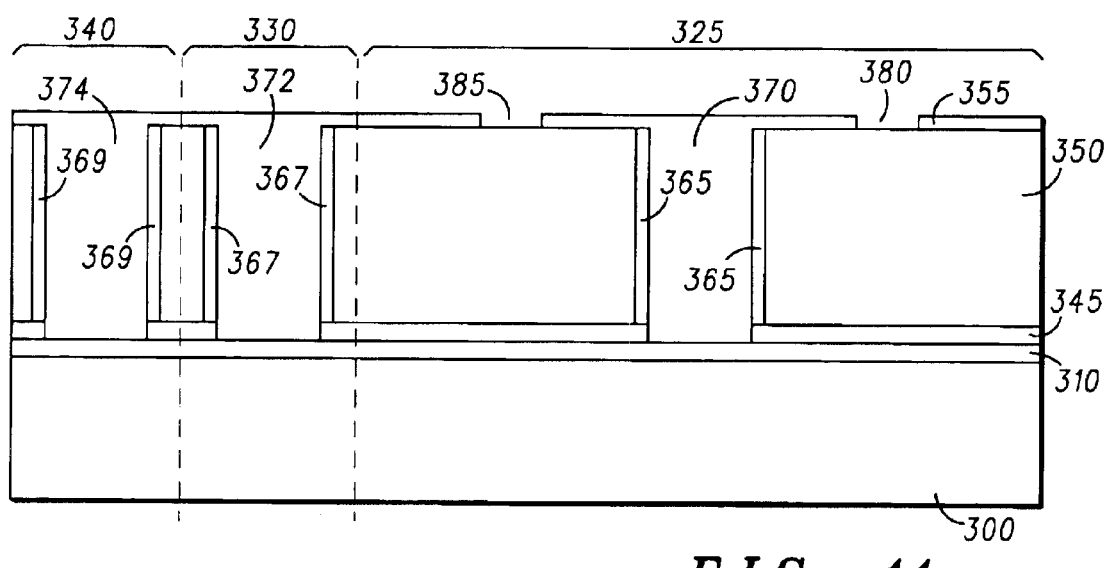
Figure 12:
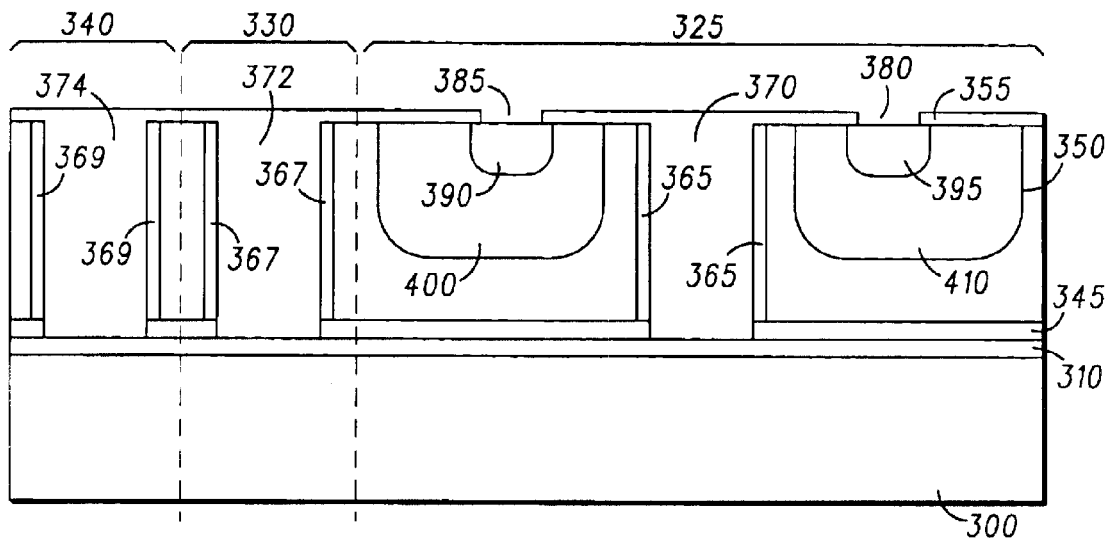
Figure 13:
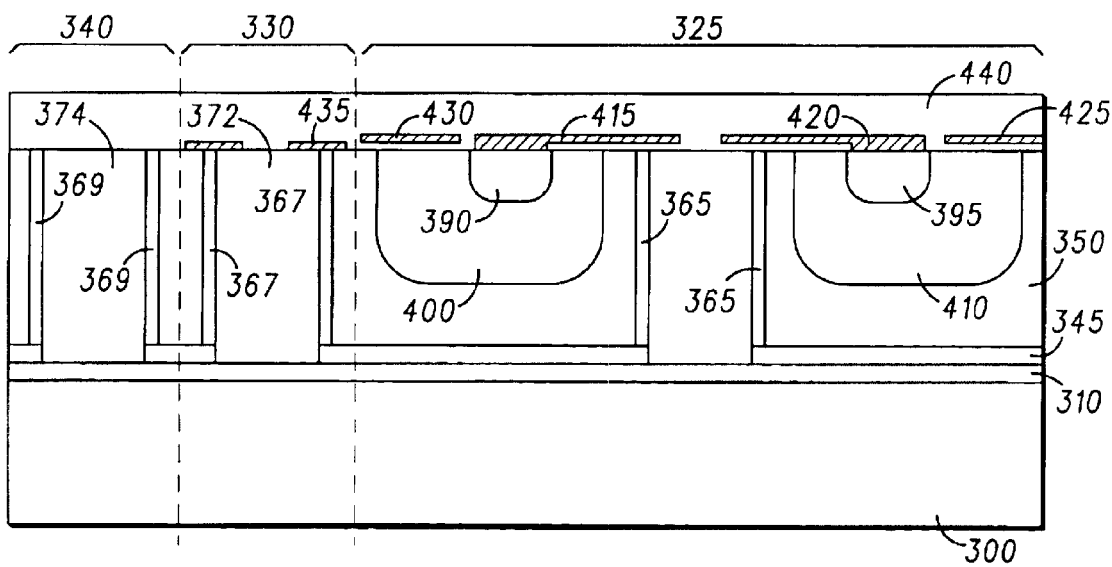
Figure 14:
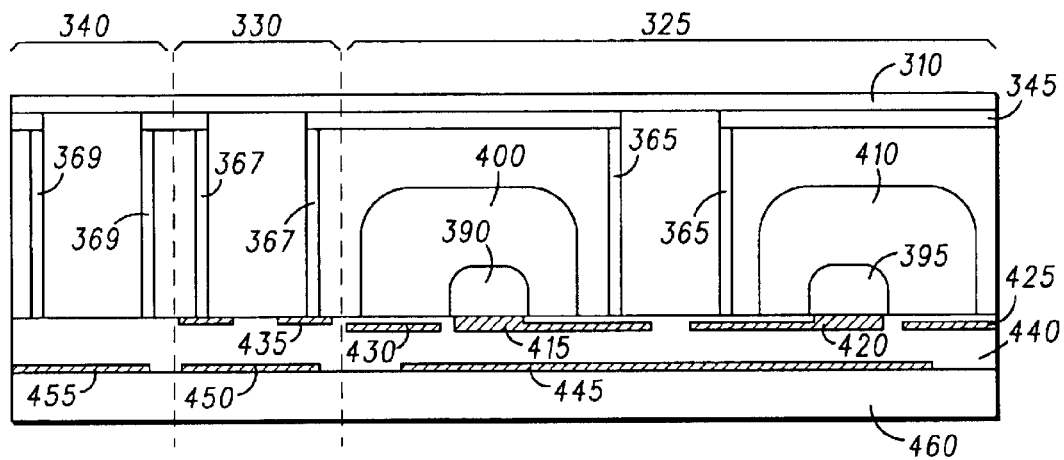
Figure 15:
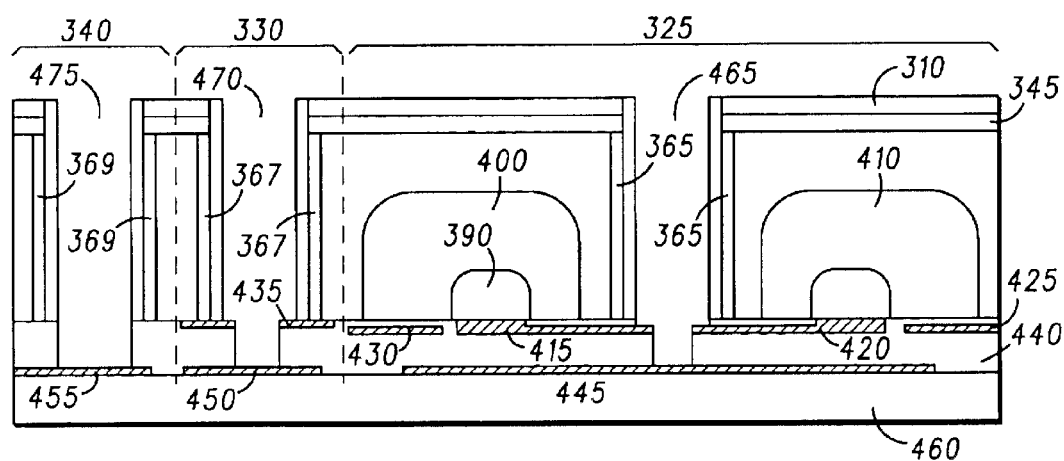
Figure 16:
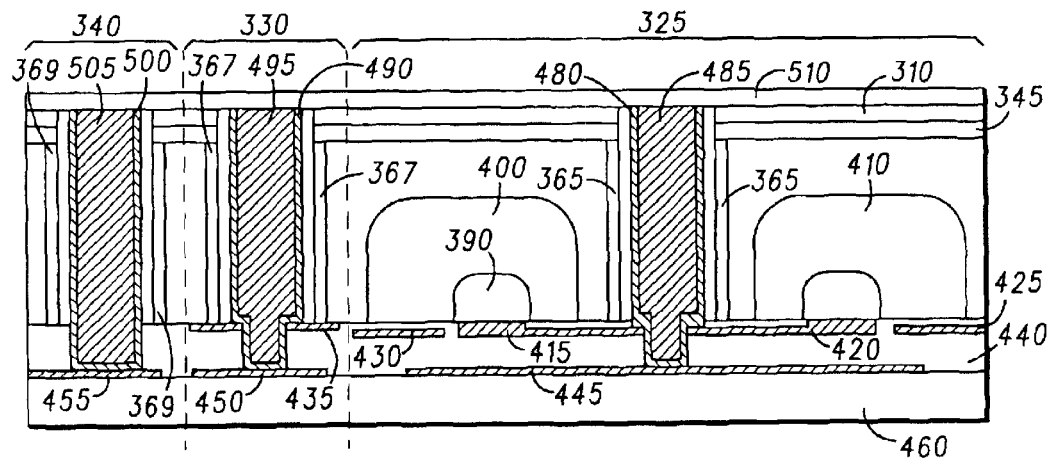
Figure 17:
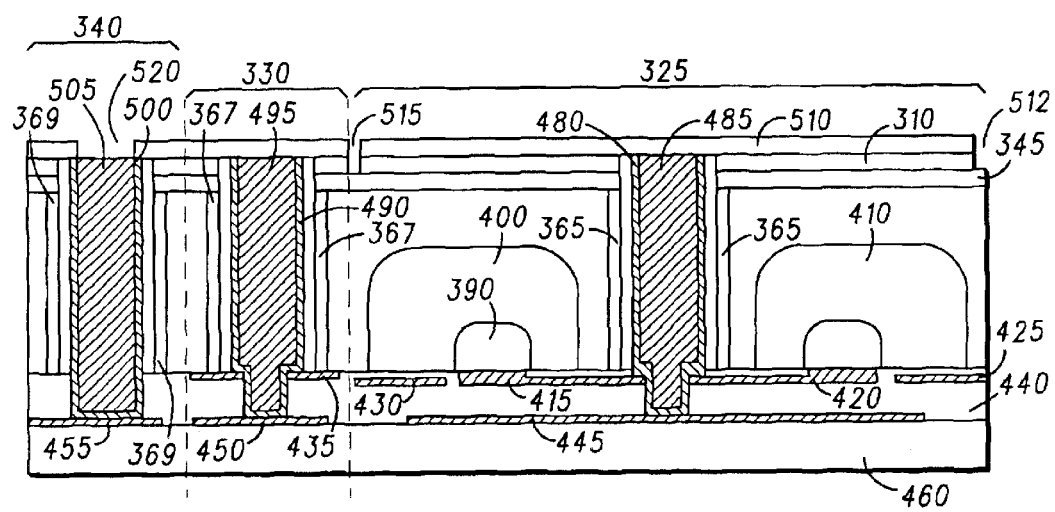
Figure 18:
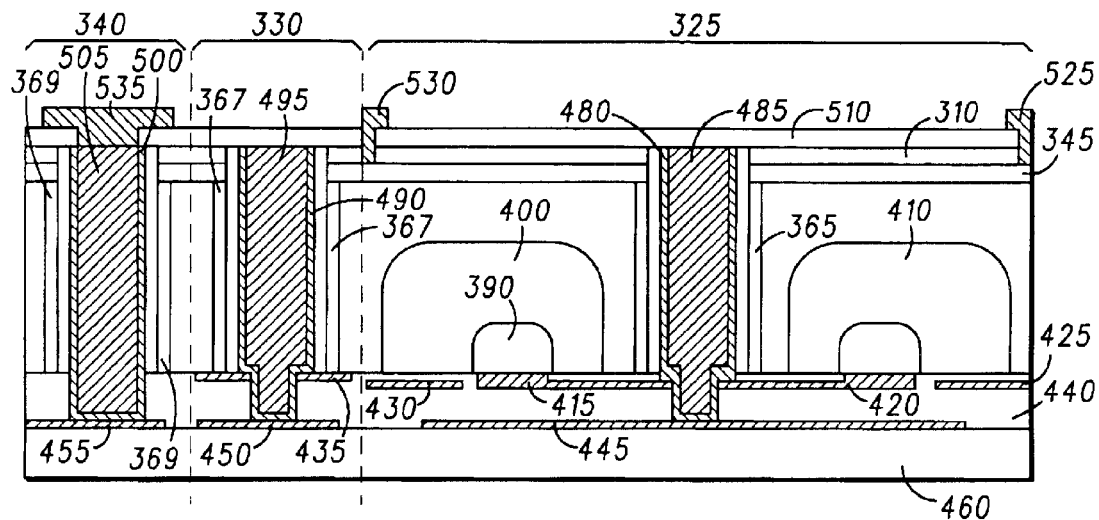
Figure 19:
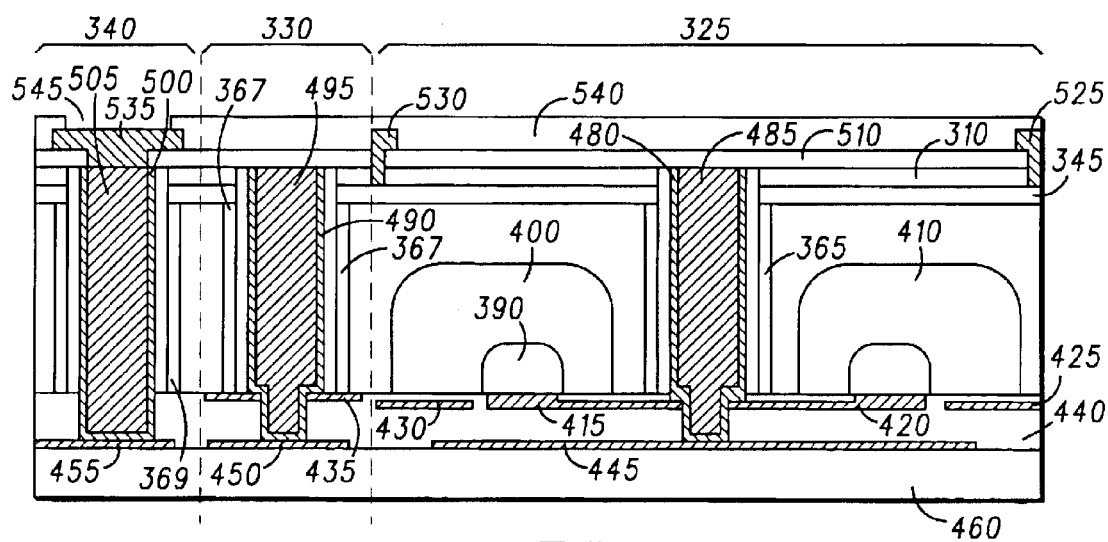
Figure 20:
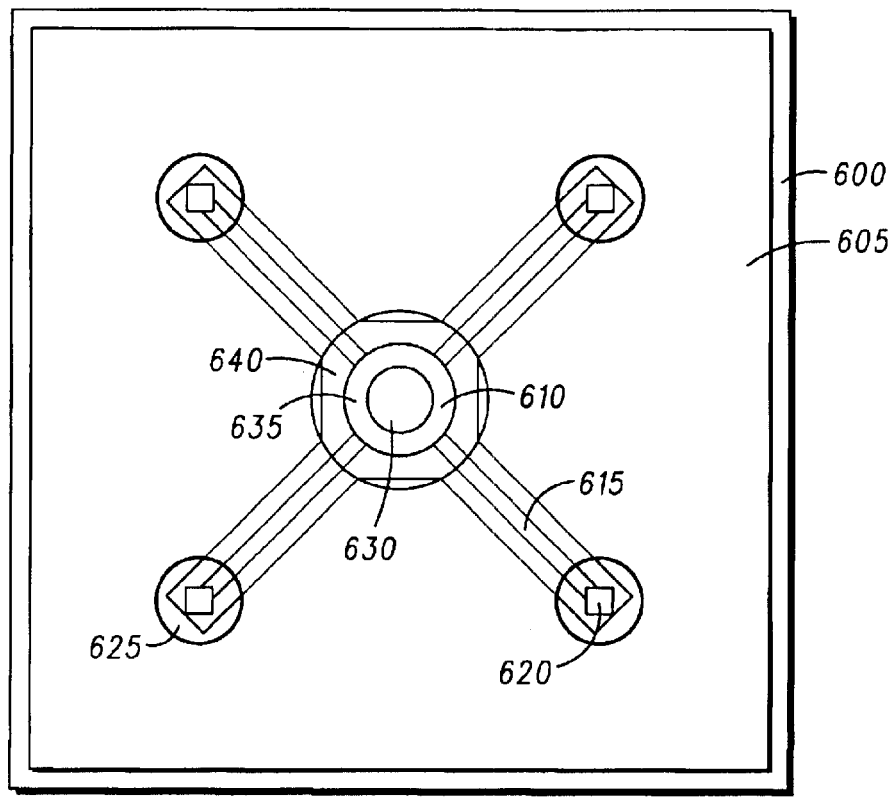
Figure 21:
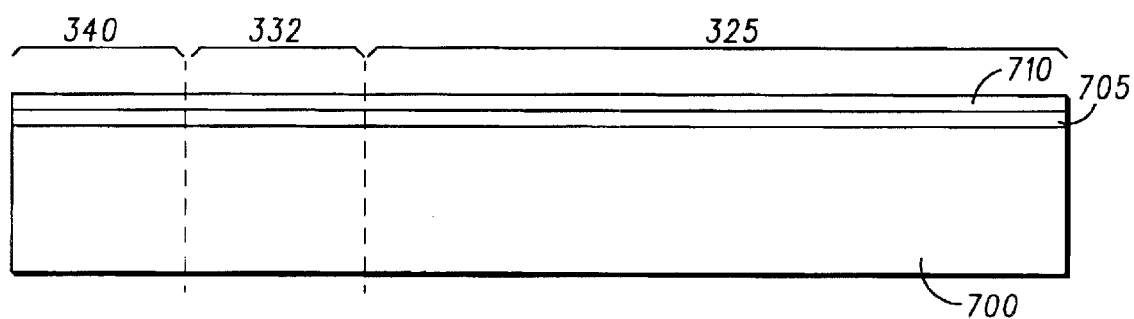
Figure 22:
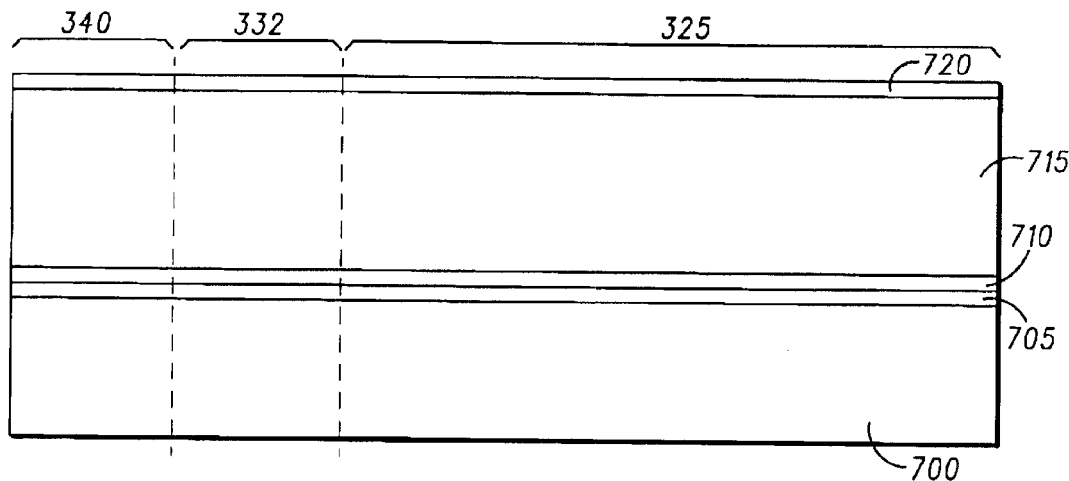
Figure 23:
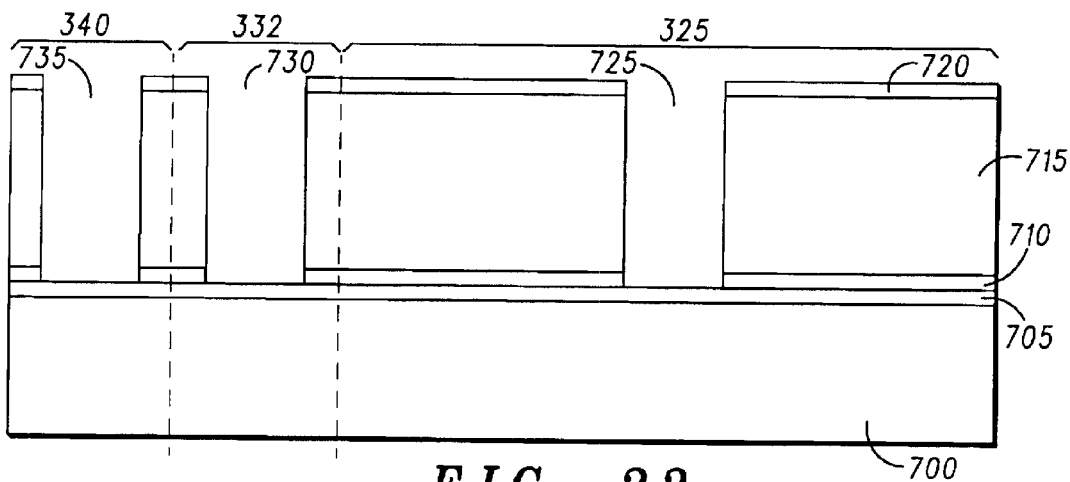
Figure 24:
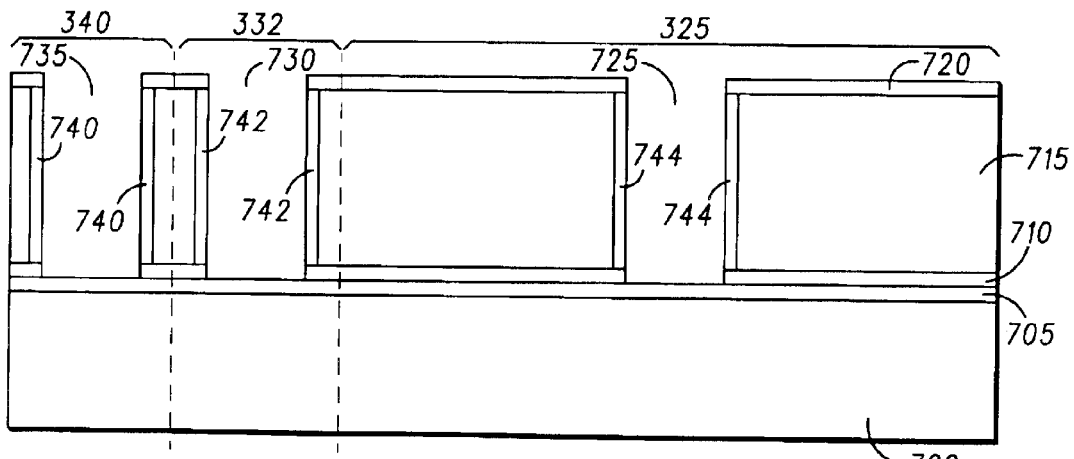
Figure 25:
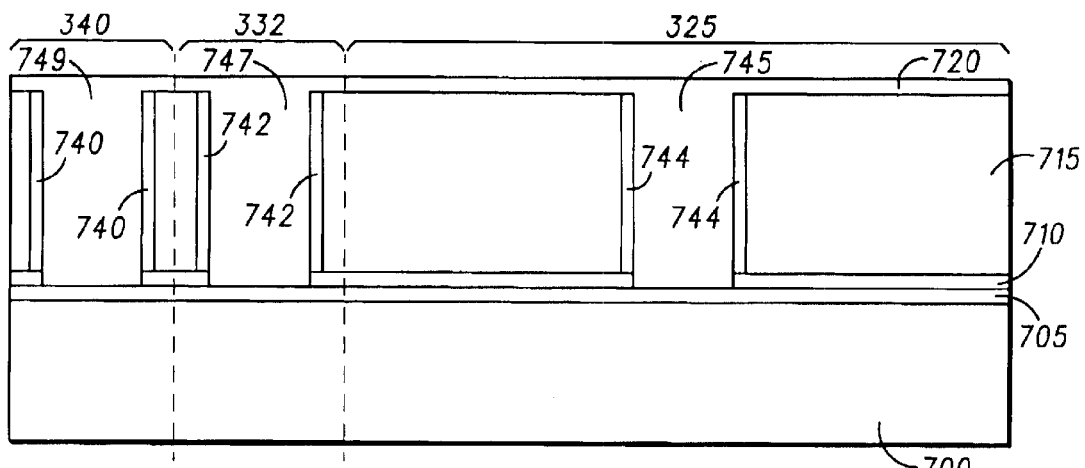
Figure 26:
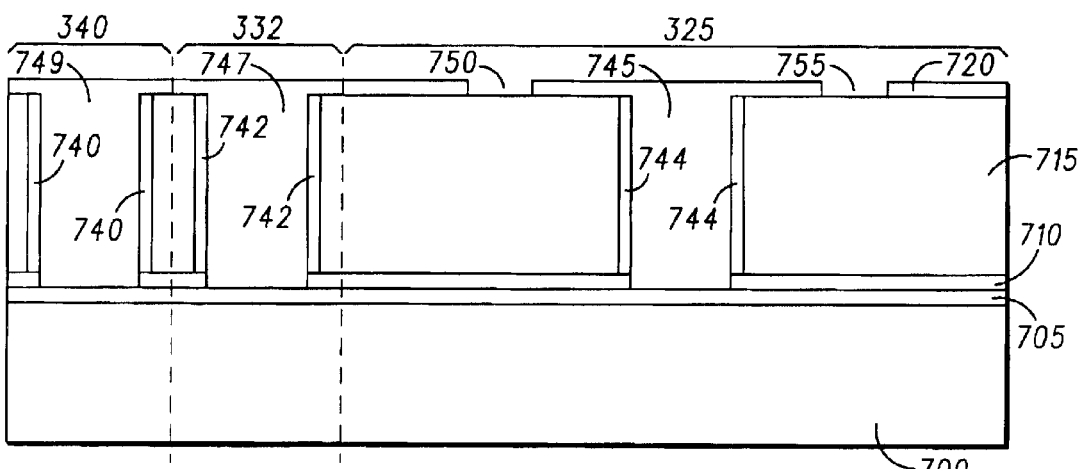
Figure 27:
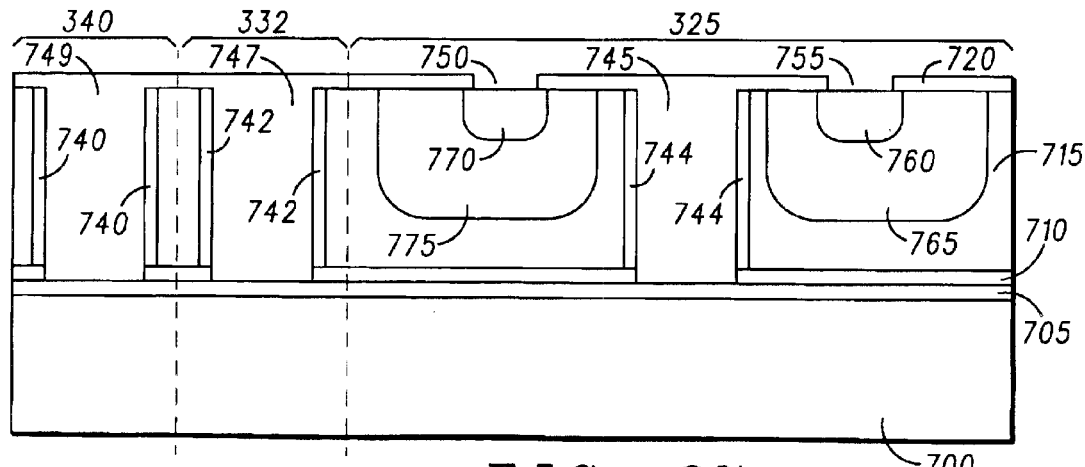
Figure 28:
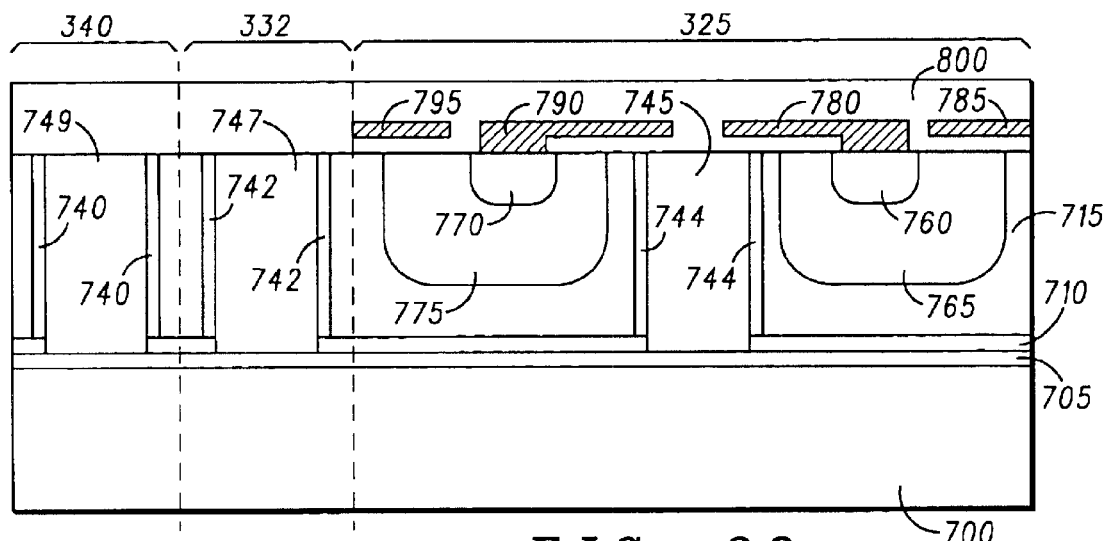
Figure 29:
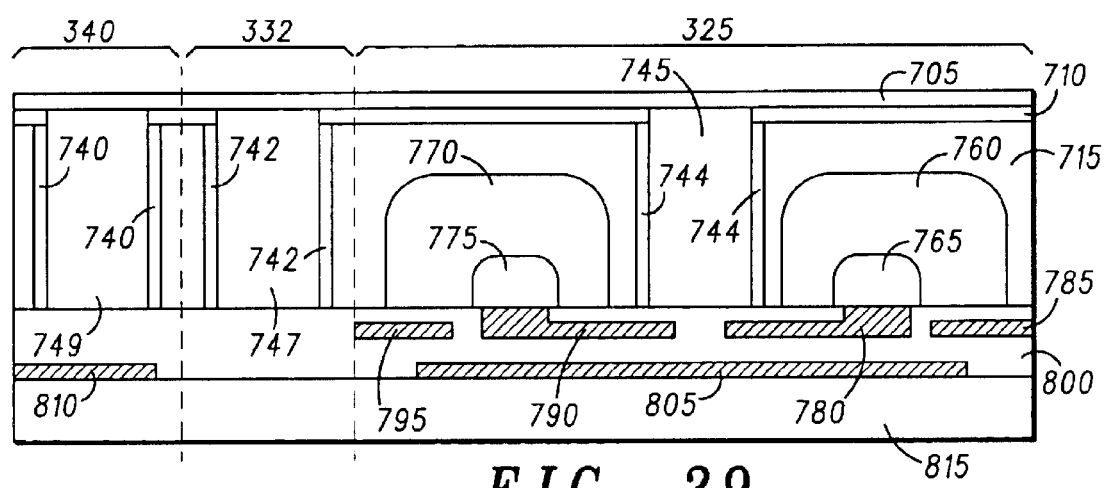
Figure 30:
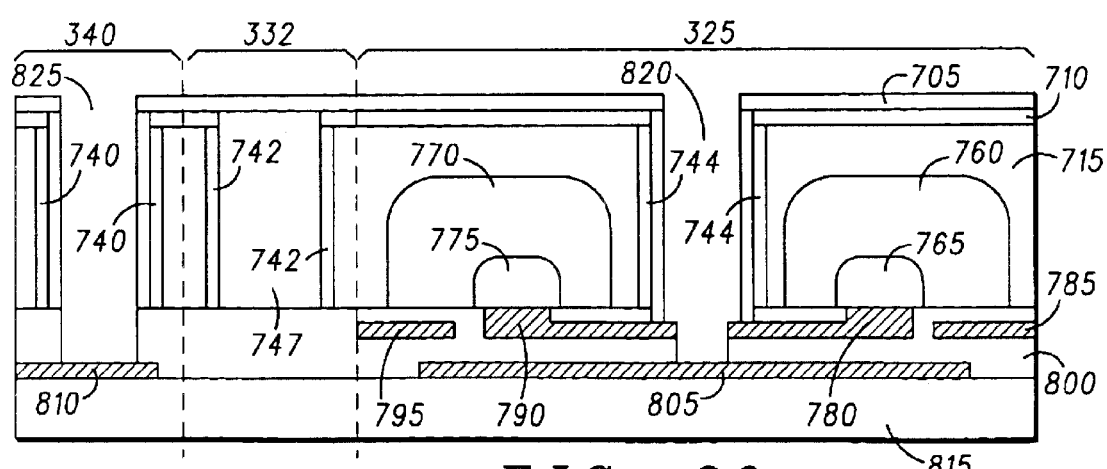
Figure 31:
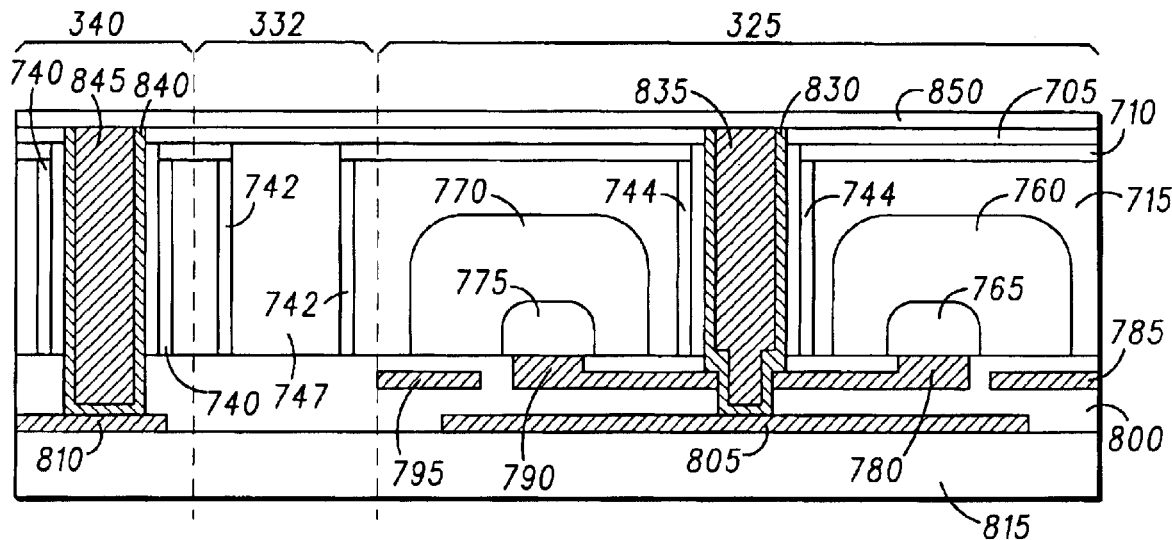
Figure 32:
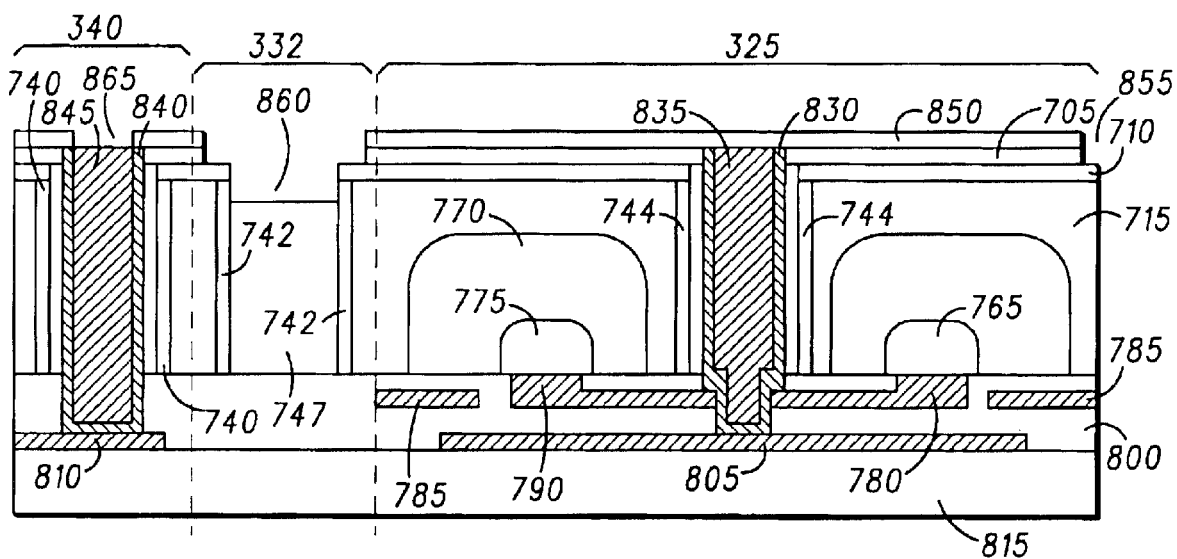
Figure 33:
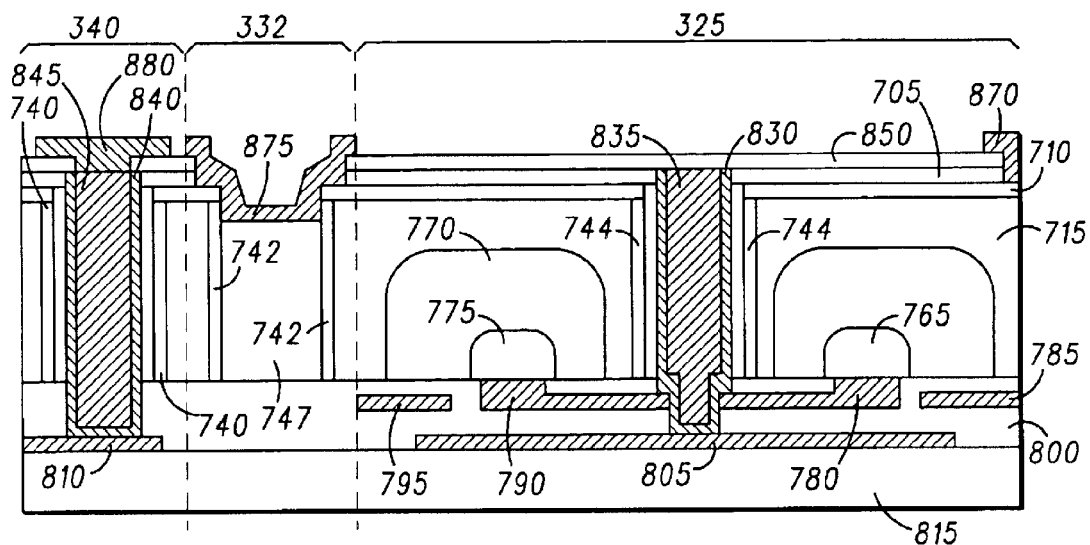
Figure 34:
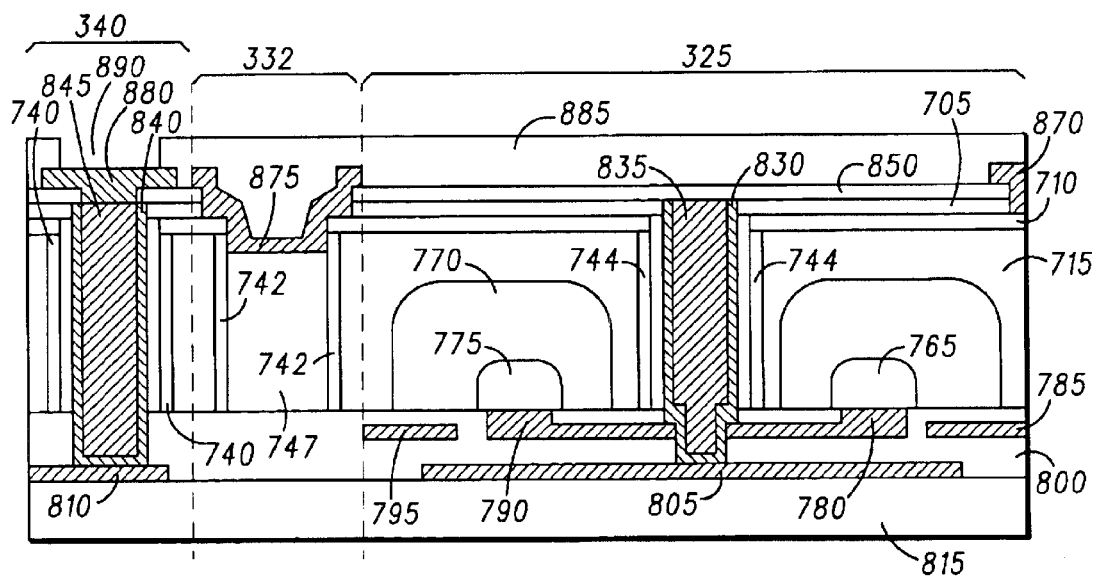
Figure 35:
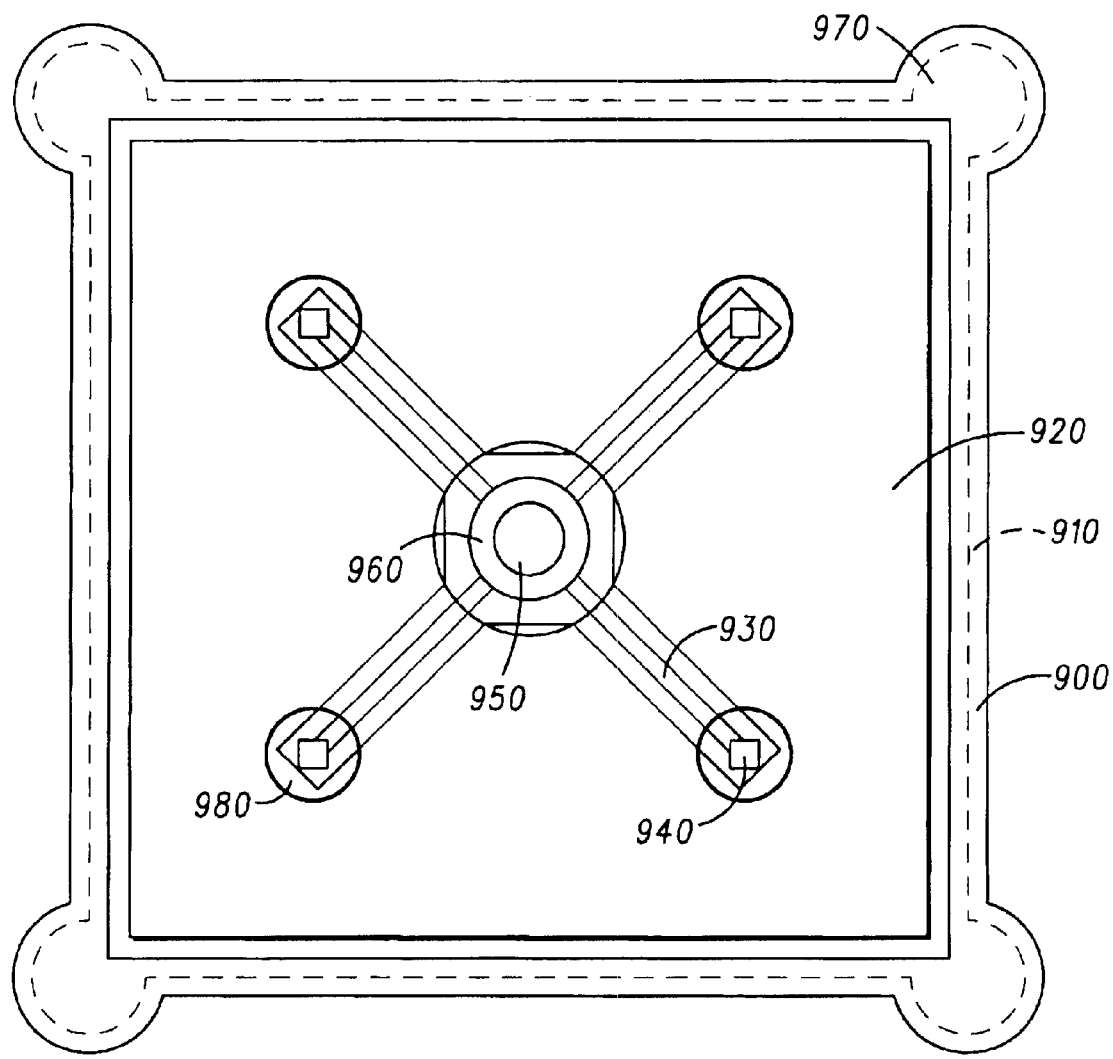

FIG. 3 representatively illustrates a plan view of a vertically integrated CMOS photosensing element in accordance with one exemplary aspect of the present invention;

FIG. 4 representatively illustrates an elevation cross-section view of the vertically integrated CMOS photosensing element representatively illustrated, for example, in FIG. 3;

FIG. 5 representatively illustrates an elevation cross-section view of a precursor structure for use in an exemplary method of fabricating an integrated photosensing device in accordance with the present invention;

FIG. 6 representatively illustrates an elevation cross-section view of an intermediate structure for use in an exemplary method of fabricating an integrated photosensing device in accordance with the present invention;

FIG. 7 representatively illustrates an elevation cross-section view of an intermediate structure for use in an exemplary method of fabricating an integrated photosensing device in accordance with the present invention;

FIG. 8 representatively illustrates an elevation cross-section view of an intermediate structure for use in an exemplary method of fabricating an integrated photosensing device in accordance with the present invention;

FIG. 9 representatively illustrates an elevation cross-section view of an intermediate structure for use in an exemplary method of fabricating an integrated photosensing device in accordance with the present invention;

FIG. 10 representatively illustrates an elevation cross-section view of an intermediate structure for use in an exemplary method of fabricating an integrated photosensing device in accordance with the present invention;

FIG. 11 representatively illustrates an elevation cross-section view of an intermediate structure for use in an exemplary method of fabricating an integrated photosensing device in accordance with the present invention;

FIG. 12 representatively illustrates an elevation cross-section view of an intermediate structure for use in an exemplary method of fabricating an integrated photosensing device in accordance with the present invention;

FIG. 13 representatively illustrates an elevation cross-section view of an intermediate structure for use in an exemplary method of fabricating an integrated photosensing device in accordance with the present invention;

FIG. 14 representatively illustrates an elevation cross-section view of an intermediate structure for use in an exemplary method of fabricating an integrated photosensing device in accordance with the present invention;

FIG. 15 representatively illustrates an elevation cross-section view of an intermediate structure for use in an exemplary method of fabricating an integrated photosensing device in accordance with the present invention;

FIG. 16 representatively illustrates an elevation cross-section view of an intermediate structure for use in an exemplary method of fabricating an integrated photosensing device in accordance with the present invention;

FIG. 17 representatively illustrates an elevation cross-section view of an intermediate structure for use in an exemplary method of fabricating an integrated photosensing device in accordance with the present invention;

FIG. 18 representatively illustrates an elevation cross-section view of an intermediate structure for use in an exemplary method of fabricating an integrated photosensing device in accordance with the present invention;

FIG. 19 generally illustrates an elevation cross-section view of an exemplary integrated photosensing device in accordance with a representative aspect of the present invention;

FIG. 20 generally illustrates a plan view of an exemplary vertically integrated photosensing device in accordance with a representative aspect of the present invention;

FIG. 21 representatively illustrates an elevation cross-section view of another precursor structure for use in another exemplary method of fabricating an integrated photosensing device in accordance with the present invention;

FIG. 22 representatively illustrates an elevation cross-section view of an intermediate structure for use in an exemplary method of fabricating an integrated photosensing device in accordance with the present invention;

FIG. 23 representatively illustrates an elevation cross-section view of an intermediate structure for use in an exemplary method of fabricating an integrated photosensing device in accordance with the present invention;

FIG. 24 representatively illustrates an elevation cross-section view of an intermediate structure for use in an exemplary method of fabricating an integrated photosensing device in accordance with the present invention;

FIG. 25 representatively illustrates an elevation cross-section view of an intermediate structure for use in an exemplary method of fabricating an integrated photosensing device in accordance with the present invention;

FIG. 26 representatively illustrates an elevation cross-section view of an intermediate structure for use in an exemplary method of fabricating an integrated photosensing device in accordance with the present invention;

FIG. 27 representatively illustrates an elevation cross-section view of an intermediate structure for use in an exemplary method of fabricating an integrated photosensing device in accordance with the present invention;

FIG. 28 representatively illustrates an elevation cross-section view of an intermediate structure for use in an exemplary method of fabricating an integrated photosensing device in accordance with the present invention;

FIG. 29 representatively illustrates an elevation cross-section view of an intermediate structure for use in an exemplary method of fabricating an integrated photosensing device in accordance with the present invention;

FIG. 30 representatively illustrates an elevation cross-section view of an intermediate structure for use in an exemplary method of fabricating an integrated photosensing device in accordance with the present invention;

FIG. 31 representatively illustrates an elevation cross-section view of an intermediate structure for use in an exemplary method of fabricating an integrated photosensing device in accordance with the present invention;

FIG. 32 representatively illustrates an elevation cross-section view of an intermediate structure for use in an exemplary method of fabricating an integrated photosensing device in accordance with the present invention;

FIG. 33 representatively illustrates an elevation cross-section view of an intermediate structure for use in an exemplary method of fabricating an integrated photosensing device in accordance with the present invention;

FIG. 34 representatively illustrates an elevation cross-section view of an intermediate structure for use in an exemplary method of fabricating an integrated photosensing device in accordance with the present invention; and FIG. 35 generally illustrates a plan view of an exemplary vertically integrated photosensing device in accordance with a representative aspect of the present invention.

Those skilled in the art will appreciate that elements in the Figures are illustrated for simplicity and clarity and have not necessarily been drawn to scale. For example, the dimensions of some of the elements in the Figures may be exaggerated relative to other elements to help improve understanding of various embodiments of the present invention. Furthermore, the terms 'first', 'second', and the like herein, if any, are used inter alia for distinguishing between similar elements and not necessarily for describing a sequential or chronological order. Moreover, the terms front, back, top, bottom, over, under, and the like in the Description and/or in the claims, if any, are generally employed for descriptive purposes and not necessarily for comprehensively describing exclusive relative position. Skilled artisans will therefore understand that any of the preceding terms so used may be interchanged under appropriate circumstances such that various embodiments of the invention described herein, for example, are capable of operation in other orientations than those explicitly illustrated or otherwise described.

REPRESENTATIVE EMBODIMENTS

The following descriptions are of exemplary embodiments of the invention and the inventors conceptions of the best mode and are not intended to limit the scope, applicability or configuration of the invention in any way. Rather, the following Description is intended to provide convenient illustrations for implementing various embodiments of the invention. As will become apparent, changes may be made in the function and/or arrangement of any of the elements described in the disclosed exemplary embodiments without departing from the spirit and scope of the invention.

A detailed description of an exemplary application, namely a system and method for providing an integrated photosensing device suitably adapted for use in C7MOS imaging applications is presented as a specific enabling disclosure that may be readily generalized by skilled artisans to any application of the disclosed system and method in accordance with various embodiments of the present invention.

Figure 1:
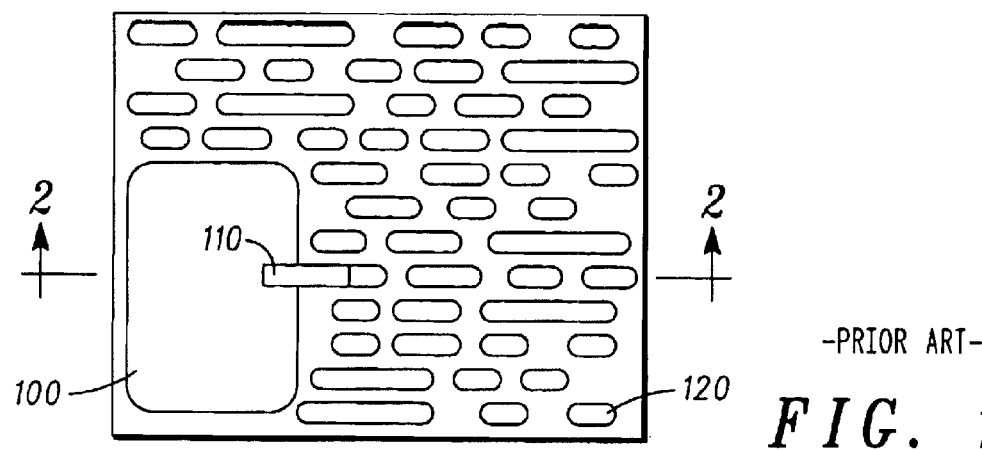
FIG. 1 depicts a plan view of a CMOS photodiode in accordance with the prior art.
Figure 2:
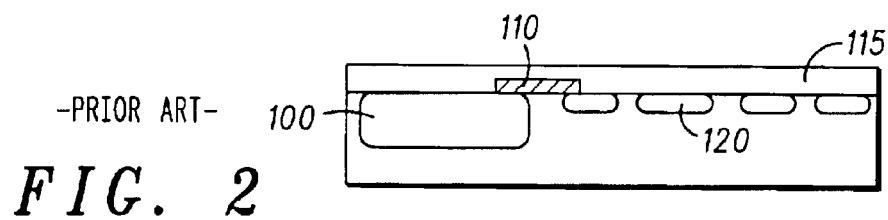
FIG. 2 depicts an elevation cross-section view of the prior art CMOS photodiode generally depicted in FIG. 1.

As previously addressed, co-integration of photosensors with CMOS electronics may operate to substantially limit both the performance of the photosensor and the flexibility of the system architectural design. This may be additionally complicated by progression to more advanced CMOS technology generations which generally utilize trench isolation, non-transparent suicides and increasing numbers of interconnect levels. These factors, as well as others, generally degrade performance of photodetectors 100 co-integrated with CMOS electronics 120, as generally depicted, for example, in FIGS. 1 and 2. In effect, the photodetector 100 becomes 'trapped' within the CMOS technology 'box' with a lateral interconnect 110 further reducing available imaging 'real estate'. One way to address this problem, in accordance with various representative aspects of the present invention, is to release the PD 200 from the 'box' and place a PD 200 array in its own separate active layer positioned over a dielectric layer 115 and a wafer surface containing the electronics 220 with a vertical interconnect 210 disposed therebetween. Such a three-dimensional, stacked configuration of the optically active layer over the electronically active layer has been termed by the Inventors herein as a "Vertically Integrated PhotoSensor" or VIPS.

Removal of the photosensors from the CMOS electronics design and fabrication 'box' allows independent optimization of photosensor device performance and system architectural design. For the photosensor, this may include, for example: choice of materials; pixel design (optical and electronic); fabrication processes resulting in detectors with much higher fill factors (on the order of about 3–4× greater); and/or the like. The utilization of the third dimension substantially obviates competition for lateral pixel area and also allows greater functionality to be incorporated into any given 2D form factor. The underlying electronics may then be designed effectively without compromise from the optical coupling requirements of the photosensor. This generally allows for the use of much needed additional layers of interconnect metallization for more efficient layout of chips and also opens the door for the incorporation of greater image processing functions on-chip with more creative architectural partitioning of the imaging system potentially leading to single-chip camera applications. In summary, vertical integration generally provides inter alia improved performance, lower system cost, increased functionality, lower power consumption and smaller form factors.

VIPS configurations additionally provide many advantages for both the active layers. In the electronic active layer, not only does the removal of the PD free up space within each pixel element for electronic circuits, but the photo-absorbing layer above it may also be suitably adapted to operate as a natural light shield. Since excellent optical coupling is a given in this arrangement, there is generally no need to limit the number of interconnect levels used. This could enable some innovative architectural partitioning of the imager (e.g., co-integration of the pixel electronics together with the image processing circuitry, for example) that could lead to improved performance and lower cost imagers.

Most of the benefits and advantages for the optically active layer generally relate to greater freedom in the design and processing of the PD devices. Since it is removed from the Si, the optically active layer may be composed of more optimal materials; i.e., materials that have higher absorption coefficients for any given spectral range of interest. These might include other semiconductor materials such as, for example: GaAs; InP; GaN; HgCdTe and their related materials and/or combinations thereof; or SiC and SiGe.

The positioning of the optically active layer over the electronic active layer offers optical advantages including a near 100% optical fill factor for the pixel, and virtual elimination of optical throughput loss and optical crosstalk generated by reflections and scattering. Additionally, a dedicated optical active layer is more amenable to advanced optical designs including backside reflecting mirrors and resonant cavities. These attributes each help boost the amount of signal captured by the PD, but the near 100% fill factor also leads to an effective reduction of the perimeter-to-area ratio and a corresponding decrease in the normalized dark current. Accordingly, both the signal and noise characteristics are greatly improved by vertical integration in accordance with various representative and exemplary aspects of the present invention.

Moreover, since the active layers are generally distinct and isolated, there is the potential for separate optimization in their fabrication processing. This factor is largely dependent on how the two layers may be brought into close proximity and will be discussed vide infra.

Although there are many possible means to realize the vertically integrated optical active layer and integrate photosensors within this layer, as generally described above, one exemplary method is detailed here for clarity. A representative process begins with a substantially fully processed CMOS "host" wafer onto which the "donor" wafer will be bonded. The host wafer typically contains electronic circuitry for in-pixel signal operations such as amplification, readout, ADC, etc. and potentially other image processing and/or peripheral circuitry. The top level of interconnect metallization on the host wafer comprises metal landing pads for the various types of interconnects to be made between the host and donor wafers. These may include, for example: the pads for intra-pixel connections between the individual photodiodes in the optically active layer and their corresponding pixel circuits in the electronic active layer on the host wafer, pads for interconnects between the common side of the photodiodes and the host wafer; and pads for I/O connections off-chip. Alignment keys for the wafer-to-wafer bonding process may also be included in this layer. These pads may be encapsulated with, for example, $SiO_2$ and the wafer planarized with CMP processing.

In this embodiment, the donor wafer starts as an SOI wafer: Si substrate and buried oxide ('BOX') layer. The SOI wafer also may be configured with a relatively thin, lowly doped $p^-$ top Si layer (on the order of about 2000–5000 Å). An intrinsic or $p^-$-epitaxial layer is then grown to a thickness on the order of about 2–4 $\mu$m to better accommodate the low absorption coefficient of the Si material. A thermal oxide is next grown on the top surface which provides a high quality interface for inter alia minimization of photodiode dark current levels. At this point, alignment keys may be formed in the Si layer to mate to the corresponding keys on the host wafer during the bonding process, and to serve as base keys for alignment of subsequent (post wafer bond) process steps. A photosensor region may be defined by further processing of the donor wafer, which may include patterning of via features followed by deposition of thermal oxide (e.g., $SiO_2$) over the processed top surface of the donor wafer.

Photodiodes may then be fabricated within this donor wafer using a series of ion implant steps. A patterned, multiple-energy, n-type implant (e.g., $P^+$) may be used to convert the thickness of the Si layer to form a column of n-type material at the center of each pixel forming the cathode of the photodiodes. A portion of this column, most generally the region near the implanted surface, may be implanted to a sufficiently high concentration to allow ohmic contact to this region. This forms a vertical, cylindrically-shaped, pn junction in which the depletion region extends laterally outward from the n-type columns to between the p-type columns. As the surrounding regions are intrinsic or nearly so, these depletion regions can generally extend laterally for many microns even to the point of overlapping with neighboring SCRs. In this case, any non-uniformities in doping level and/or thickness may result in non-uniform photocarrier collection regions and "ill defined" pixels. To alleviate this situation, a patterned, multiple-energy, p-type implant (e.g., B+) may be employed to form relatively narrow, moderately doped walls that act to limit the lateral extent of the depletion regions and define the shape of the pixels. This column may also contain a highly doped portion, again most likely near the implanted surface, for ohmic contacting purposes. Through this ohmic contact, the implanted p-type grid can then be used to uniformly apply a bias (typically ground) to the common cathodes of the array of photodiodes.

After the formation of the photodiodes, an optically reflective structure (comprising, for example: thermal oxide layer; a dielectric layer, such as, for example, $SiO_2$, $Si_3N_4$, etc.; and a bond interface layer) may optionally be formed over the top of the wafer. This structure may ultimately become a backside reflector once the wafer is flipped over, wafer bonded and the substrate removed. The reflector may alternatively, conjunctively or sequentially comprise a single metallic layer (e.g., Al, Ag, Au, etc.) or multiple, alternating layers of high and low refractive index dielectric materials forming a distributed Bragg reflector (DBR). Blanket metallic reflectors generally offer the advantage of high reflectivity in thin films, but pose challenges for the subsequent etching of the contact vias. Alternatively, the metal layer may be deposited, prior to bonding, and patterned with a hole for the via, but at the cost of an additional masking step. Dielectric-based DBRs are generally easier to etch through, but multiple layer pairs are typically required to achieve sufficient reflectivity; for example, the application of a single layer pair DBR made from $SiO_2/Si_3N_4$. Finally, even without an optimized reflector integral to the transferred layer structure, some level of reflectance could likely be realized from the interconnect landing pads residing directly underneath the pixels within the top level of metallization on the host CMOS wafer. In this case, a smooth, reflective surface and a large fill factor of these landing pads would also be beneficial.

After both host and donor wafers are planarized and prepped, they are aligned and bonded together with the substrate removed, as described vide supra. The CMOS host wafer may generally comprise a Si substrate, n-type pixel interconnects, multiple levels of metal interconnects, alignment keys, I/O pads, p-type contacts and/or the like. The host and donor wafers are bonded through interface in dielectric layer. Alternatively, a glue layer such as BCB may be employed for bonding the wafers together. After substrate removal, the top surface of the bonded wafer composite is the original buried oxide layer (BOX) of the SOI donor wafer which acted as an etch stop in the substrate removal process. Alignment of all subsequent process steps may be made relative to the keys within the transferred layer that are now exposed from the back side.

Thereafter, relatively high aspect ratio via holes are etched within each pixel from the composite structure's top surface, through: the BOX layer at the surface; the Si semiconductor layer; the bottom reflector; and the $SiO_2$ layers on either side of the water bonded interface, stopping on the landing pads of the CMOS wafer. Care must be taken with this etch step to ensure both optimal performance and reliability. To simultaneously meet the requirements of high pixel fill factor and thick optical absorption layer for high conversion efficiency, the aspect ratio of this etch must be suitably high, particularly as the pixel pitch is reduced. On the other hand, because of the differing material types that must be penetrated, it may be challenging to achieve sufficiently smooth sidewalls to allow high yield of the sidewall ohmic contacts and metal interconnection from the contact to the landing pad during subsequent processing. This etch step is also used to define a via within the p+ implanted regions where sidewall contacts and interconnects will also be made.

After the vias are cleared, metallization is deposited covering the sidewalls and bottom of the etched via forming ohmic contacts to the $n^+$ material (or $p^+$ material) along the sidewall and interconnecting this contact to the via landing pad. Optionally, the metallized vias may then be plugged with a plated metal (e.g., Cu and/or the like) then the surface re-planarized.

As a final fabrication step, access vias to the large area I/O pads around the perimeter of the chip may be opened. This step has non-critical etch requirements and may easily be accomplished with standard etch processes.

The optically active layer may be transferred to the CMOS wafer via any wafer bonding technique now known or otherwise hereafter described in the art. This result can be achieved in many ways, but a representative and exemplary approach may be one in which the two components to be bonded are coated with $SiO_2$ and subsequently planarized. The surfaces are then chemically treated and thereafter mated together to form a covalent-based bond at the $SiO_2$ coordination interface. The bonding process generally takes only several seconds and may be performed at room temperature. The substrate originally containing the optical active layer is then removed by chemical and/or mechanical means (e.g., CMP). In order to achieve suitably thin transferred layers, it may be helpful to the substrate removal process if this wafer further comprises a suitably adapted etch stop layer.

There are many possible modes of implementing the desired vertically integrated structure. Some representative variables in the process may include the partitioning of the photodiode fabrication process into pre-bond and post-bond sections. At one extreme, a "blank" optical active layer having substantially no pre-processing may be bonded with the final diode fabrication and interconnection to the CMOS wafer performed at some point after the bonding. This may be attractive from the standpoint that critical alignment of the blank layer to the CMOS wafer would generally not be required. A drawback of this approach is that is highly undesirable to have to do high temperature processing to fabricate the photosensors after the bonding process as this may have an adverse impact on the already processed CMOS devices below. The preferred approach may be more toward the other extreme in which the photodiodes are substantially completely fabricated prior to bonding leaving only via etching, ohmic contact formation, inter-active layer interconnection and passivation processing for post-bond processing.

Two representative and exemplary modes are disclosed in which bonding may be performed. The first is wafer-to-wafer bonding in which two (or more) wafers (preferably of matching diameter for greatest efficiency) are mated and bonded in a substantially unitary step. If the photodiodes (along with alignment keys) are pre-processed in the active layer, a critical alignment must generally be done before the wafers are mated. Subsequent processing is then best aligned to the optically active layer with any misalignment tolerance generally accommodated in oversized interconnect metallization pads in the CMOS wafer. If the optically active layer is blank, alignment may be registered to keys in the CMOS wafer (if made visible with a coarsely aligned clearing etch step, for example). In this bonding mode, the surface area of the optical active layer is generally not efficiently utilized since, typically, the active area does not match the entire area of the CMOS chip.

The second representative bonding mode is die-to-wafer. Here, the wafer containing the optical active layer is typically diced prior to bonding and the chips are individually aligned to corresponding sites on the CMOS wafer. If the optically active layer was initially blank, then these die-to-wafer bonds generally do not require any critical alignment and substantially all of the post-bond processing may be easily aligned to the exposed alignment keys in the CMOS wafer. Contrariwise, if the optically active layer contains processed photodiodes, then each die generally needs to be critically aligned to each site on the CMOS wafer. Subsequent processing typically must then be aligned at each individual site, or if aligned simultaneously, to the CMOS wafer, where any error in the die-to-wafer alignment step is generally absorbed in the optical active layer.

Regardless of the bonding method employed, the end result is a monocrystalline semiconductor layer that has been transferred to the surface of the CMOS wafer within which the array of photodiodes reside. The primary advantage of having this optically active layer comprised of single crystal material (as opposed to amorphous or poly-crystalline material) is the potential for higher performance and flexibility. In principle, the single crystal material generally demonstrates much lower dark currents due inter alia to the absence of a high density of grain boundaries and other mid-gap defects as compared with non-crystalline material. In fact, there is no fundamental reason why photosensors fabricated in such materials cannot approach the performance of high quality CCDs. A secondary benefit is the potential for additional levels of electronic integration within this layer that would otherwise be unavailable in the conventional art.

Unlike the Thin Film on ASIC (TFA) approach of fabricating integrated photosensing arrays, representative and exemplary embodiments of the present invention provide a CMOS-based imaging array having photosensing elements fabricated in a vertically integrated optically active layer comprising monocrystalline material(s) that is/are subsequently transferred to the CMOS wafer surface. The thickness of the optically active layer is generally sufficiently thin to allow for a high density of electrical interconnects to the CMOS wafer (e.g., about one per pixel; on the order of about 1 connection per 10–100 square microns). The interconnections themselves may be manufactured using standard, wafer level, CMOS via and metalization technology.

Skilled artisans will appreciate that another benefit of a transferred optical active layer is the ability to utilize materials that are generally non-native to the Si substrate containing the CMOS. Such non-native semiconductor materials may have widely varying optical absorption characteristics, allowing the option to choose a material that is the most optimally suited for a particular application. These materials may include the compound semiconductors such as GaAs, InP, and GaN and related materials, as well as Ge, SiGe, SiC, etc. These representative materials generally span the entire range of UV, visible, and NIR wavelengths. The absorption of Si is relatively weak across the visible range while many of the other materials are an order of magnitude stronger. This fact implies that optically active layers of non-Si materials could be much thinner, for the same absorption level, making the fabrication of the photosensors substantially easier.

Image sensing outside of the visible band may be applied to many applications. In the near UV, some examples may include: forensics; dermatology for detection of skin cancers; "solar blind" imaging for applications in which solar illumination (sunlight) is perceived as a noise source; and/or the like. NIR imaging may also be used for "night vision" (using either natural or artificial illumination), alcohol-based flame detection, biological analysis, etc.

In other applications, multi-spectral sensing and comparative imaging may be of great value. Here, information may be extracted from the differences (or similarities) in images taken within different ranges of the spectrum (e.g., UV, visible, NIR). With the vertical integration methodology described herein, one sensor may be included within the CMOS layer (for example, a visible sensor) and another sensor (for example, UV or NIR) could be implemented within the vertically integrated active layer.

What has been described thus far is the implementation of only photosensing devices within the vertically integrated active layer. Clearly, more functionality could be implemented within this layer in the form of, for example, CMOS electronics; which circuitry could be used inter alia for parallel processing of captured images.

With the bonding approaches described, vertical integration of active layers need not be limited to a single layer. As long as the wafer surface can be sufficiently planarized to allow substantially void-free bonding, the process could be repeated indefinitely; in principle, to provide a vertical stack of active layers all or some of which are interconnected and each providing some distinct or otherwise additional functionality.

EXEMPLARY PHOTODIODE DESIGN AND FABRICATION

An exemplary photodiode (PD) design has been described vide supra as part of the generally disclosed Vertically Integrated PhotoSensor concept; the design and fabrication of which generally involves the fabrication of vertical interconnects between the two active layers. It turns out that the previously described coupling may be limiting, in some applications, to the design and performance of the PD for inter alia the following reasons. Since the metal plug which provides the interconnection between the active layers also serves as the ohmic contact to the cathode of the photodiode, the implant forming the PD cathode is generally needed to penetrate substantially the entire thickness of the absorbing layer. The high dose and energy of the implants required for this purpose can lead to residual implant damage that may be excessively difficult or even impossible to reduce to the required levels. This residual damage can result in elevated dark current levels and degraded signal to noise ratios.

Additionally, the limitation in depth of (e.g., maskable) implants can also lead to a limitation in the absorber layer thickness which in turn may limit the responsiveness of the PD, again degrading SNR performance. Furthermore, since the ohmic metalization is generally in direct contact with the semiconductor along substantially the entire depth of the interconnect via, this fabrication approach may not be applicable to other PD designs of interest. In particular, epitaxially grown-in junctions; as may be the preferred (or in some cases, even only) option for use with most compound semiconductor materials, are generally not allowable because the pn junction would be shorted out along the via sidewall.

Moreover, the concept of vertical integration may be applied to other types of devices besides photodiodes. Contact of the metal to the sidewall of the via can preclude the implementation of other types of devices, even something as simple as an isolated "through via" interconnection between top and bottom active layers. For these reasons and others, it may be desirable to have a PD and an interconnection scheme that are generally not coupled together in their design and fabrication.

A potentially more attractive alternative to overt vertical integration may be to decouple the photodiode from the interconnect via. This may be accomplished with the fabrication process illustrated in FIGS. 5–35 and described herein.

An exemplary donor wafer flow starts with a relatively thin (on the order of up to or more than about 1000 Å) SOI layer 320 deposited over BOX 310 on a Si substrate 300, as generally depicted, for example, in FIG. 5. The starting wafer may optionally further comprise substantially predefined areas for development of PD features 325, optional in-pixel ground contacts 330, feed thru and I/O pads 340 and/or the like. A blanket implant (for example, B+) is performed to convert the SOI layer 320 to p-type 345 with relatively high doping level (on the order of up to or more than about 1E19 cm$^{-3}$) as representatively illustrated in FIG. 6. A relatively thick (on the order of up to or more than about 2 $\mu$m) epi layer 350 with relatively low doping level (e.g., near intrinsic) may then grown over the p-type SOI layer 345 and the layer capped with thermal oxide 355 and/or a nitride layer (see, for example, FIG. 7). A masked dry etch may then be performed to etch vias 364, 362, 360 through the epi 350 and SO layer 345 down the BOX layer 310 in the locations where vertical interconnects are to be formed (see, for example, FIG. 8). After the etch mask is removed, an angled p-type implant may optionally be performed to convert the sidewalls 369, 367, 365 of the vias 364, 362, 360 to p$^+$ (see, for example, FIG. 9). This may provide inter alia an accumulated interface in the region rendering it benign, for example, to carrier generation and/or recombination processes which could affect responsiveness and/or noise. The etched vias are then thermally oxidized (see, for example, FIG. 10) to improve interface quality and backfilled with SiO$_2$ 370 and the surface re-planarized. Windows 380, 385 in the top dielectric layers may then be formed (see, for example, FIG. 11), with subsequent n-type implantation 390, 395 done to form the p-n junctions 390, 400, 395, 410 in the selected regions (of these, 400 and 410 are space charge regions), as generally illustrated, for example, in FIG. 12. The etch and implant mask may then be removed and the implant activated with an anneal. Thereafter, metallization may be deposited 435, 430, 415, 420, 425 (Ti/TiN/Al, for example) and patterned by etching (see, for example, FIG. 13). This metal may be suitably configured or otherwise adapted to serve multiple purposes. For example, the some of the metallized features may form ohmic contacts 415, 420 to the exposed n$^+$ regions 390, 395, while other metal features may form runners connecting these n$^+$ regions to a metal ring at the interconnect via regions, while still other metal features may form floating backside optical reflector elements 430, 425 which may operate to extend the effective optical thickness of the absorbing layer. The wafer may then be coated with a layer of SiO$_2$ 440 and re-planarized. In one exemplary application, in accordance with representative aspects of the present invention, the resulting donor wafer component is suitably prepared for subsequent bonding to a CMOS host wafer 460, in FIG. 14, in a region proximate to a metallized surface 445, 450, 455 of the host 460. The wafers are bonded, in one exemplary embodiment, with an SiO$_2$ interface, and the substrate of the donor wafer removed by CMP and etching. The resulting structure is representatively illustrated in FIG. 14 in which the photosensing layer appears vertically flipped with the final metallization layer of the host wafer shown below it.

The post-bond, interconnect fabrication is illustrated in FIGS. 15 et sequens. Fabrication generally begins with a patterned dry etch through the center of the dielectric plug down to the Cu catch pads 445, 450, 455 of the top metal layer of the host wafer 460. These vias must generally remain within the oxide plug, thus providing isolation between subsequent metal and the semiconductor. The diameter of the vias are generally large enough to capture the metal feature 420, 415, 435 (a ring or line) connected to the n$^+$ regions. These metal features also generally operate as a mask for subsequent etching down to the Cu catch pads. The end result is a two-tiered via with exposed metal "shoulders" at the second tier, as generally depicted, for example, in FIG. 15. A Cu damascene process may then be employed to plug 500, 505, 490, 495, 480, 485 these vias and make interconnection between the metal shoulders of the donor wafer and the Cu catch pads 445, 450, 455 of the host wafer 460 (see, for example, FIG. 16). After re-planarization, dielectric 510 may be deposited over the surface. Windows 520, 515, 512 in this dielectric layer may then opened, for example in the case of window 520 to the Cu plug in regions where electrical connection through the plug to the host wafer below is desired (feed through and I/O pad region 340), and substantially all the way through the BOX layer 310 to the semiconductor in regions where ohmic contact is to be formed (see, for example, FIG. 17). Thereafter, metallization 535, 530, and 525 (Ta/Al, for example) may then be applied and patterned to form I/O pads and a common contact grid (typically held at ground potential in operation), both on the top surface (see, for example, FIG. 18). Finally, a passivation layer 540 of dielectric may be deposited and windows 545 opened over the I/O pads for contacting.

Also shown, for example in FIG. 19, but not referenced in the above description, is an optional, in-pixel ground contact that may be formed by placing the metal layer 435 on the donor wafer, in substantially direct contact with the semiconductor immediately surrounding the first via such that it forms an ohmic contact to the edge of the p+ implanted region. As with the n-type via interconnection, a metal feature (collar, donut, line, or other) may be formed within the diameter of the subsequent oxide via etch to form an exposed metal shoulder within this via to permit inter alia interconnection with the Cu pad 450 below.

The resulting structure, in plan view, is generally depicted in FIG. 20, comprising, for example: a contact grid 600; a backside reflector 605; a backside contact 'donut' 610; a backside interconnect 615; contact vias 620; n+ implant regions 625; an inner via 630 to the Cu pad; an outer via and Cu plug 635; and an oxide plug 640 through the SOI layer.

Alternate Exemplary Photodiode Design and Fabrication

An alternate exemplary donor wafer flow starts with a relatively thin (on the order of up to or more than about 1000 Å) p layer 710 deposited over BOX 705 on a Si substrate 700, as generally depicted, for example, in FIG. 21. The starting wafer may optionally further comprise substantially predefined areas for development of PD features 325, $p^+$ common contacts 332, feed thru and I/O pads 340 and/or the like. A relatively thick (on the order of up to or more than about 2 $\mu$m) epi layer 715 with relatively low doping level (e.g., near intrinsic) may then grown over the $p^-$ layer 710 and the layer capped with thermal oxide 720 and/or a nitride layer (see, for example, FIG. 22). A masked dry etch may then be performed to etch vias 735, 730, 725 through the epi 715 and $p^-$ layer 710 down the BOX layer 705 in the locations where interconnects are to be formed (see, for example, FIG. 23). After the etch mask is removed, an angled p-type implant may optionally be performed to convert the sidewalls 740, 742, 744 of the vias 735, 730, 725 to $p^+$ (see, for example, FIG. 24). This may provide inter alia an accumulated interface in the region rendering it benign, for example, to carrier generation and/or recombination processes which could affect responsiveness and/or noise. The etched vias are then thermally oxidized (see, for example, FIG. 25) to improve interface quality and back-filled with $SiO_2$ 720 and the surface re-planarized. Windows 750, 755 in the top dielectric layers may then be formed (see, for example, FIG. 26), with subsequent n-type implantation 770, 760 done to form the p-n junctions 770, 775, 760, 765 in the selected regions, as generally illustrated, for example, in FIG. 27. The etch and implant mask may then be removed and the implant activated with an anneal. Thereafter, metallization may be deposited 795, 790, 780, 785 (Ti/TiN/Al, for example) and patterned by etching (see, for example, FIG. 28). This metal may be suitably configured or otherwise adapted to serve multiple purposes. For example, the some of the metallized features may form ohmic contacts 790, 780 to the exposed $n^+$ regions 770, 760, while other metal features may form runners connecting these $n^+$ regions to a metal ring at the interconnect via regions, while still other metal features may form floating backside optical reflector elements 795, 785 which may operate to extend the effective optical thickness of the absorbing layer. The wafer may then be coated with a layer of $SiO_2$ 800 and re-planarized. In one exemplary application, in accordance with representative aspects of the present invention, the resulting donor wafer component is suitably prepared for subsequent bonding to a CMOS host wafer 815 in a region proximate to a metallized surface 805, 810 of the host 815. The wafers are bonded, in one exemplary embodiment, with an $SiO_2$ interface, and the substrate of the donor wafer removed by CMP and etching. The resulting structure is representatively illustrated in FIG. 29 in which the photo-sensing layer appears vertically flipped with the final metallization layer of the host wafer shown below it.

The post-bond, interconnect fabrication is illustrated in FIGS. 30 et sequens. Fabrication generally begins with a patterned dry etch through the center of the dielectric plug down to the Cu catch pads 810, 805 of the top metal layer of the host wafer 815. These vias must generally remain within the oxide plug, thus providing isolation between subsequent metal and the semiconductor. The diameter of the vias are generally large enough to capture the metal feature 780, 790 (a ring or line) connected to the $n^+$ regions. These metal features also generally operate as a mask for subsequent etching down to the Cu catch pads. The end result is a two-step via with exposed metal "shoulders" at the second step, as generally depicted, for example, in FIG. 30. A Cu damascene process may then be employed to plug 840, 845, 830, 835 these vias and make interconnection between the metal shoulders of the donor wafer and the Cu catch pads 810, 805 of the host wafer 815 (see, for example, FIG. 31). After re-planarization, dielectric 850 may be deposited over the surface. Windows 865, 860, 855 in this dielectric layer may then be opened, for example in the case of window 865 to the Cu plug in regions where electrical connection through the plug to the host wafer below is desired (feed through and I/O pad region 340), and substantially all the way through the BOX layer 710 to the semiconductor in regions 860 where ohmic contact is to be formed (see, for example, FIG. 32). Thereafter, metallization 880, 875, 870 (Ta/Al, for example) may then be applied and, for example, patterned to form I/O pads 880 and a common contact grid 870 (typically held at ground potential in operation), on the top surface (see, for example, FIG. 33). Metallization 875 forms and ohmic contact to the implanted p+ layer 742 along the sidewalls of the upper portions of the oxide-filled trench 747. This contact may be used as an alternate approach to forming the common p-type contact to the top surface (under the BOX layer in FIG. 33) of the Si epi layer under the grid contact. This would be the preferred approach in cases where the p-type surface concentration at the BOX interface cannot be made sufficiently high to allow sufficiently good ohmic contact quality for this common electrode. A combination of the sidewall p+ contact and the grid contact can also be implemented as is illustrated in the Figures here (FIGS. 34 and 35). Finally, a passivation layer 885 of dielectric may be deposited and windows 890 opened over the I/O pads for contacting.

The resulting structure, in plan view, is generally depicted in FIG. 35, comprising, for example: oxide plugged vias with sidewall p+ contacts 970 with sidewall $p^+$ contacts; backside reflector material 920; topside contact vias 910; topside p-contact metal 900; backside n-implant 940; backside n-contact metal 930; contact via lower section 950; contact via upper section 960; and backside n-contact metal 980. Skilled artisans will appreciate that various other geometries and/or configurations may be achieved, including inter alia displacement of the interconnect via to be at least one of substantially and entirely under the grid.

As mentioned vide supra, the illustrated approaches have many advantages stemming inter alia from the decoupling of the photodiode and the interconnect via. This offers greater flexibility for optimization of the design and fabrication of each of these components separately. The location of the PD junction generally does not need to be aligned with the sidewalls of the via allowing for more optimal positioning to improve, for example, carrier collection efficiency and responsiveness as well as to avoid space charge region overlap with lower quality (i.e., leaky) interfaces which will generally increase dark current and contribute noise. This flexibility in locating the collecting junctions makes this approach scalable with pixel pitch. Likewise, the area of the PD is not tied to the cylinder of the interconnect via and can be accordingly optimized to minimize capacitance without trading off responsiveness. As an example, the junction area may be split into small islands and distributed across a plane normal to incident light (see FIGS. 20, 35).

Similarly, the interconnect vias are substantially more versatile in accordance with various exemplary aspects of the present invention, since inter alia isolation of the metal plugs from the semiconductor permits substantially direct electrical feed-throughs between two or more active layers generally without the compromise of parasitic leakage.

Although low leakage electrical feed throughs can be generated with this approach, there may be a parasitic capacitance associated with the same. Skilled artisans will appreciate that careful designs should be able to minimize this effect. Also, the presence of the interconnect via in proximity to the PD may impact its responsiveness due to interface recombination velocity. Care should also be taken in design to manage the space charge region away from this interface as it may be a source of additional dark current. For example, thermal oxidation of the via sidewall should minimize this effect; however, skilled artisans will appreciate that various other mechanisms may be employed to achieve a substantially similar result, and the same shall be regarded as within the scope of the present invention.

In the foregoing specification, the invention has been described with reference to specific exemplary embodiments; however, it will be appreciated that various modifications and changes may be made without departing from the scope of the present invention as set forth in the claims below. The specification and figures are to be regarded in an illustrative manner, rather than a restrictive one and all such modifications are intended to be included within the scope of the present invention. Accordingly, the scope of the invention should be determined by the claims appended hereto and their legal equivalents rather than by merely the examples described above. For example, the steps recited in any method or process claims may be executed in any order and are not limited to the specific order presented in the claims. Additionally, the components and/or elements recited in any apparatus claims may be assembled or otherwise operationally configured in a variety of permutations to produce substantially the same result as the present invention and are accordingly not limited to the specific configuration recited in the claims.

Benefits, other advantages and solutions to problems have been described above with regard to particular embodiments; however, any benefit, advantage, solution to problems or any element that may cause any particular benefit, advantage or solution to occur or to become more pronounced are not to be construed as critical, required or essential features or components of any or all the claims.

As used herein, the terms "comprises", "comprising", or any variation thereof, are intended to reference a non-exclusive inclusion, such that a process, method, article, composition or apparatus that comprises a list of elements does not include only those elements recited, but may also include other elements not expressly listed or inherent to such process, method, article, composition or apparatus. Other combinations and/or modifications of the above-described structures, arrangements, applications, proportions, elements, materials or components used in the practice of the present invention, in addition to those not specifically recited, may be varied or otherwise particularly adapted by those skilled in the art to specific environments, manufacturing specifications, design parameters or other operating requirements without departing from the general principles of the same.

We claim:

1. A method for making an integrated CMOS-based imaging component, said method comprising the steps of:
    providing at least one of a donor SOI wafer and a donor p-type wafer;
    providing a host CMOS wafer;
    optionally at least one of growing and at least partially converting said SOI wafer to p-type;
    growing at least one of an intrinsic or p-epitaxial layer on said donor wafer;
    growing a thermal oxide layer over said at least one of an intrinsic or p-epitaxial layer of said donor wafer;
    optionally forming alignment keys in a Si layer of said donor wafer; said alignment keys corresponding to base keys on said host wafer;
    defining an optically active, monocrystalline photosensor region in said donor wafer;
    fabricating at least one photodiode in said donor wafer using a plurality of ion implant steps;
    optionally forming an optically reflective structure over the top surface of said donor wafer;
    at least one of planarizing and preparing said donor wafer for bonding;
    at least one of planarizing and preparing said host wafer for bonding;
    aligning said host wafer with said donor wafer;
    bonding said host wafer with said donor wafer through an interface substantially proximate to metal interconnects of said host CMOS wafer;
    removing substrate material from said donor surface of the resulting donor/host composite structure;
    etching at least one via within at least one region of the donor/host composite structure's top surface down to landing pads of said CMOS wafer;

at least one of clearing, metallizing and plugging said vias with a metal;

optionally re-planarizing the top surface of said donor/host composite structure;

optionally forming at least one of a top side anti-reflective coating and a top side passivation layer; and opening access vias to I/O pads embedded in said CMOS wafer.

2. The method of claim 1, wherein said optically active photosensor region comprises at least one of Si, GaAs, InP, GaN, HgCdTe, a-Si, p-Si, x-Si, Ge, SiGe, SiC, a monocrystalline material, a polycrystalline material and an amorphous material.

3. The method of claim 1, wherein said host CMOS layer is substantially fully pre-processed.

4. The method of claim 1, wherein said bonding of said host wafer with said donor wafer comprises at least one of wafer-to-wafer bonding and die-to-wafer bonding.

* * * * *